(12) United States Patent
Sugahara

(10) Patent No.: US 8,168,253 B2
(45) Date of Patent: May 1, 2012

(54) METHOD OF MANUFACTURING PIEZOELECTRIC ACTUATOR AND METHOD OF MANUFACTURING LIQUID TRANSPORTING APPARATUS

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1079 days.

(21) Appl. No.: 12/029,883

(22) Filed: Feb. 12, 2008

(65) Prior Publication Data

US 2008/0199598 A1 Aug. 21, 2008

(30) Foreign Application Priority Data

Feb. 16, 2007 (JP) ................................. 2007-035688
Feb. 16, 2007 (JP) ................................. 2007-035689

(51) Int. Cl.
*B05D 5/12* (2006.01)
(52) U.S. Cl. ....................................................... 427/100
(58) Field of Classification Search .................. 427/100; 374/71, 68, 72, 40
See application file for complete search history.

(56) References Cited

U.S. PATENT DOCUMENTS

| 2005/0068377 | A1* | 3/2005 | Ishikawa et al. | ............. | 347/68 |
| 2005/0231073 | A1 | 10/2005 | Sugahara et al. | | |
| 2005/0285911 | A1* | 12/2005 | Sugahara | ................. | 347/71 |
| 2006/0044359 | A1 | 3/2006 | Sugahara | | |
| 2006/0268075 | A1 | 11/2006 | Sugahara et al. | | |
| 2007/0064052 | A1* | 3/2007 | Sugahara | ................. | 347/58 |

FOREIGN PATENT DOCUMENTS

JP 2005317952 A 11/2005
JP 2006096034 A 4/2006

OTHER PUBLICATIONS

The State Intellectual Property Office of the People's Republic of China, Notification of the Third Office Action for Chinese Patent Application No. 200810080770.6 (counterpart to above-captioned patent application), issued Apr. 20, 2011.
European Patent Office; Search Report in European Patent Application No. 08002463.1-1251 (counterpart to the above-captioned U.S. patent application) mailed July 17, 2009.
European Patent Office, Office Action for European Patent Application No. 08002463.1 (counterpart to above-captioned patent application), dated Jan. 16, 2012.

* cited by examiner

*Primary Examiner* — Michael Cleveland
*Assistant Examiner* — Tabassom Tadayyon Eslami
(74) *Attorney, Agent, or Firm* — Baker Botts, L.L.P.

(57) ABSTRACT

A recess is formed on an upper surface of a vibration plate at a position corresponding to a pressure chamber. Next, a low-elasticity material having a lower modulus of elasticity than the vibration plate is filled in the recess. Then, aerosol including a piezoelectric material particles and carrier gas is sprayed on the upper surface of the vibration plate to form a piezoelectric layer. At this time, the particles of the piezoelectric material do not adhere to a surface of the low-elasticity material filled in the recess, and hence the piezoelectric layer can be formed only in an area excluding the surface of the low-elasticity material. Thus, there is provided a method of manufacturing a piezoelectric actuator, the method capable of easily preventing, when forming the piezoelectric layer by an aerosol deposition method, formation of the piezoelectric layer on a surface of the recess.

12 Claims, 18 Drawing Sheets

SCANNING DIRECTION
PAPER FEEDING DIRECTION

_US 8,168,253 B2_

METHOD OF MANUFACTURING PIEZOELECTRIC ACTUATOR AND METHOD OF MANUFACTURING LIQUID TRANSPORTING APPARATUS

CROSS-REFERENCE TO RELATED APPLICATION

The present application claims priority from Japanese Patent Application Nos. 2007-035688 and 2007-035689, both filed on Feb. 16, 2007, the disclosure of which is incorporated herein by reference in its entirety.

BACKGROUND OF THE INVENTION

1. Field of the Invention

The present invention relates to a method of manufacturing a piezoelectric actuator and a method of manufacturing a liquid transporting apparatus.

2. Description of the Related Art

Conventionally, as an ink-jet head which jets ink from nozzles, there is know one having a piezoelectric actuator which applies a jetting pressure to ink using a piezoelectric deformation (piezoelectric distortion) generated when an electric field operates on a piezoelectric material layer.

For example, a piezoelectric actuator of an ink-jet head described in Japanese Patent Application Laid-open No. 2006-96034 has a vibration plate which is made of metal and covers a plurality of pressure chambers formed in a channel unit, a piezoelectric layer arranged on an upper surface of the vibration plate, and a plurality of individual electrodes arranged respectively in areas facing the plurality of pressure chambers on an upper surface of the piezoelectric layer. Then, in this piezoelectric actuator, when a predetermined drive voltage is applied between the individual electrodes on the upper surface of the piezoelectric layer and the vibration plate as a common electrode located on a lower side of the piezoelectric layer, the piezoelectric layer contracts and a bending deformation is generated in the vibration plate. Then, the volume in the pressure chambers changes according to this deformation of the vibration plate, and thereby a jetting pressure is applied to the ink in the pressure chambers.

Further, in the piezoelectric actuator of Japanese Patent Application Laid-open No. 2006-96034, recess portions (trenches, grooves) are formed in an upper surface of a vibration plate. As the recess portions, there are disclosed one formed in an area facing a pressure chamber and one formed in an outside area not facing a pressure chamber. Then the piezoelectric layer is formed by depositing particles of a piezoelectric material on the entire upper surface of the vibration plate including the recess portions using an aerosol deposition method (AD method) or the like. Then, since it is more difficult for particles to be deposited in a recess portion than in a surrounding flat area thereof, the piezoelectric layer becomes partly thinner in areas of the vibration plate where the recess portions are formed. As a result, in the areas where the recess portions are formed, the thickness of both the vibration plate and the piezoelectric layer, namely, the rigidity of the piezoelectric actuator becomes low locally.

When the recess portions of the vibration plate are arranged in the areas facing the pressure chambers, the vibration plate can be easily deformed in the areas facing the pressure chambers. In other words, it becomes possible to reduce the drive voltage needed for obtaining a predetermined deformation amount (namely, a volume change amount in a pressure chamber). Further, when the recess portions of the vibration plate are each arranged in an area between adjacent pressure chambers, pressure fluctuation (crosstalk) due to propagation of the deformation of the vibration plate between the adjacent pressure chambers from one to the other is suppressed.

In view of reducing the drive voltage by facilitating the deformation of the vibration plate in the areas facing the pressure chambers, or suppression of the crosstalk between adjacent pressure chambers, it is preferable that no piezoelectric material is deposited on surfaces of the recess portions, so that the rigidity of the piezoelectric actuator in the areas where the recess portions are formed is decreased further. However, in the piezoelectric actuator described in Japanese Patent Application Laid-open No. 2006-96034, the amount of the piezoelectric material deposited in the recess portions is smaller than on a flat area other than the recess portions, but the piezoelectric material still deposits therein to some degree. Further, although it is possible to remove the piezoelectric layer deposited in the recess portions by laser or the like, the removal requires high processing accuracy so as not to remove the piezoelectric layer on the necessary areas, and addition of such steps increases the manufacturing cost.

SUMMARY OF THE INVENTION

An object of the present invention is to provide a method of manufacturing a piezoelectric actuator, the method capable of easily preventing, when forming a piezoelectric layer by an AD method on a surface of a vibration plate in which recess portions are formed, formation of the piezoelectric layer on surfaces of the recess portions, and to provide a method of manufacturing a piezoelectric actuator, the method capable of easily removing a piezoelectric layer formed on surfaces of recess portions of a vibration plate.

According to a first aspect of the present invention, there is provided a method of manufacturing a piezoelectric actuator, the method including: providing a base member including a non-interference portion and a vibration plate which is joined on a joining surface thereof to cover the non-interference portion, the vibration plate having a stacking surface on which the vibration plate is stacked on the base member and which is located on a side opposite to the joining surface;

forming a recess in the stacking surface of the vibration plate at a position corresponding to the non-interference portion;

filling, in the recess of the vibration plate, a low-elasticity material having a modulus of elasticity lower than that of the stacking surface of the vibration plate;

forming a piezoelectric layer by blowing aerosol including particles of a piezoelectric material and a carrier gas onto the stacking surface of the vibration plate to deposit the particles of the piezoelectric material on an area, of the stacking surface, different from a surface of the low-elasticity material filled in the recess; and forming a first electrode arranged on one surface of the piezoelectric layer and a second electrode arranged on the other surface of the piezoelectric layer.

According to the first aspect of the present invention, after the low-elasticity material having a smaller modulus of elasticity than the vibration plate is filled in the recess portion of the vibration plate, the piezoelectric layer is formed by blowing (spraying) the aerosol including particles of the piezoelectric material and the carrier gas on the vibration plate to make the particles collide with the vibration plate and deposit thereon. Here, when the aerosol is sprayed on the surface of the vibration plate on which the low-elasticity material is provided, it is known that adhering of material particles is hindered on the surface of the low-elasticity material having a low modulus of elasticity (that is, having a low surface hardness) (see Japanese Patent Application Laid-open No. 2005-317952). Accordingly, the particles of the piezoelectric material do not deposit on the surface of the low-elasticity material filled in the recess portion, and the piezoelectric layer 31 is formed only on an area other than the surface of this low-elasticity material 50. In other words, formation of the piezoelectric layer on the surface of the recess portion formed in the vibration plate can be prevented just by adding a simple step of filling the low-elasticity material in the recess portion before forming the piezoelectric layer by the AD method.

In the method of manufacturing the piezoelectric actuator according to the present invention, the low-elasticity material may have fluidity.

In this case, since one having fluidity is used as the low-elasticity material, filling of the low-elasticity material in the recess portion can be performed easily. Further, since the recess portion is formed in the vibration plate in advance and then the low-elasticity material is filled therein, the low-elasticity material having fluidity can be settled in a predetermined area where it is desired to prevent formation of the piezoelectric layer.

The method of manufacturing the piezoelectric actuator according to the present invention may further include removing the low-elasticity material after the piezoelectric layer is formed. In this manner, by removing the low-elasticity material in the recess portion after the piezoelectric layer is formed, rigidity of the piezoelectric actuator further decreases in the area where the recess portion is formed in the vibration plate.

The method of manufacturing the piezoelectric actuator according to the present invention may further include performing a heat treatment on the piezoelectric layer after the piezoelectric layer is formed, and a thermal decomposition temperature of the low-elasticity material may be lower than a heat treatment temperature for the piezoelectric layer in the heat treatment.

When the piezoelectric layer is formed by the AD method, micronization of particles, lattice failure, and/or the like occur by the collision with the vibration plate, and hence in this state it often happens that a necessary piezoelectric characteristic for deforming the vibration plate is not obtained. Accordingly, to improve the piezoelectric characteristic, normally a heat treatment (annealing) is performed on the piezoelectric layer formed by the AD method. Here, in the present invention, since the thermal decomposition temperature of the low-elasticity material is lower than the heat treatment temperature (annealing temperature) of the piezoelectric layer, the low-elasticity material thermally decomposes and evaporates during the heat treatment. That is, the heat treatment of the piezoelectric layer and the removal of the low-elasticity material can be performed at the same time, and hence it becomes possible to reduce the manufacturing steps of the piezoelectric actuator.

In the method of manufacturing the piezoelectric actuator according to the present invention, the recess may be formed on the stacking surface of the vibration plate at an area facing the non-interference portion. In this manner, by forming the recess in the area of the vibration plate facing the non-interference portion (deformation allowing portion), and further by not allowing the piezoelectric layer to be deposited on the surface of this recess portion, the vibration plate becomes easy to deform in the area facing the non-interference portion, and thereby it becomes possible to reduce the drive voltage.

In the method of manufacturing the piezoelectric actuator according to the present invention, the recess may be formed on the stacking surface of the vibration plate at an area facing a peripheral portion of the non-interference portion. In this case, the piezoelectric layer is formed in an area, where the recess portion is not formed, facing a center portion of the non-interference portion. Therefore, by arranging the first electrode and the second electrode so as to sandwich this piezoelectric layer, the center portion area where the piezoelectric layer is formed becomes a driving area where the piezoelectric layer itself contracts to generate a deformation in the vibration plate. On the other hand, the piezoelectric layer is not formed in an area facing the peripheral (edge) portion of the non-interference portion, and this area becomes a driven area which deforms in a driven manner according to the deformation of the vibration plate generated by the driving area.

In the method of manufacturing the piezoelectric actuator according to the present invention, the recess may be formed on the stacking surface of the vibration plate at an area facing a center portion of the non-interference portion. In this case, the piezoelectric layer is formed in an area, where the recess portion is not formed, facing a peripheral edge portion of the non-interference portion. Therefore, by arranging the first electrode and the second electrode so as to sandwich this piezoelectric layer, the peripheral edge portion area where the piezoelectric layer is formed becomes a driving area where the piezoelectric layer itself contracts to generate a deformation in the vibration plate. On the other hand, the piezoelectric layer is not formed in an area facing a center portion of the non-interference portion, and this area becomes a driven area which deforms in a driven manner according to the deformation of the vibration plate generated by the driving area.

In the method of manufacturing the piezoelectric actuator according to the present invention, the base member may have a plurality of individual non-interference portions as the non-interference portion and a partition wall partitioning the plurality of individual non-interference portions; and the recess may be formed on the stacking surface of the vibration plate at an area facing the partition wall. In this manner, by forming the recess portion in the area of the vibration plate facing the partition wall portion and further by not allowing the piezoelectric layer to be deposited on the surface of this recess portion, it becomes difficult for a deformation of the vibration plate to propagate between two deformation allowing portions separated by the partition wall portion, and the crosstalk is suppressed.

In the method of manufacturing the piezoelectric actuator according to the present invention, the vibration plate may be composed of a metal material, a predetermined reference potential may be constantly applied to the first electrode, and one of the reference potential and a predetermined drive potential that is different from the reference potential, may be selectively applied to the second electrode, and the method may further include: forming an insulating layer covering the recess on the stacking surface of the vibration plate after the recess is formed in the stacking surface;

forming the first electrode on a surface of the insulating layer at an area not facing the recess; and forming the second electrode, on the other surface of the piezoelectric layer on a side opposite to the vibration plate, at an area facing the first electrode after forming the piezoelectric layer on a surface of the insulating layer to cover the first electrode.

When the vibration plate is composed of a metal material, the recess portion can be easily formed by etching. However, since the piezoelectric material do not deposit on the surface of the recess portion when the piezoelectric layer is formed, there is a fear that, when the surface of the recess portion remains to be exposed, a short circuit occurs between the recess portion surface of the electrically conductive vibration plate and the second electrode arranged on a side of the piezoelectric layer opposite to the vibration plate. However, in the present invention, since the insulating layer is formed so as to cover the recess portion on a stacking surface of the vibration plate, the short circuit between the vibration plate and the second electrode can be prevented securely. Further, the first electrode arranged on the surface of the piezoelectric layer on the vibration plate side is insulated from the vibration plate having electric conductivity by the insulating layer covering the vibration plate. Further, since this first electrode is covered by the piezoelectric layer, a short circuit between the first electrode and the second electrode is also prevented.

In the method of manufacturing the piezoelectric actuator according to the present invention, the low-elasticity material may be shaped to have a pellet or bar form. In this case, since the low-elasticity material is a solid material in a particle form having no fluidity, the low-elasticity material can be arranged easily in the recess portion.

According to a second aspect of the present invention, there is provided a method of manufacturing a liquid transporting apparatus, the method including: providing a channel unit in which a liquid channel including a pressure chamber is formed;

providing a vibration plate which is joined on a joining surface thereof to one surface of the channel unit to cover the pressure chamber, the vibration plate having a stacking surface on which the vibration plate is stacked to the base member, and which is located on a side opposite to the joining surface;

forming a recess in the stacking surface of the vibration plate at a position corresponding to the pressure chamber;

filling, in the recess of the vibration plate, a low-elasticity material having a modulus of elasticity lower than the stacking surface of the vibration plate;

forming the piezoelectric layer by blowing aerosol including particles of a piezoelectric material and a carrier gas onto the stacking surface of the vibration plate to deposit the particles of the piezoelectric material on an area different from a surface of the low-elasticity material filled in the recess;

forming a piezoelectric actuator by arranging a first electrode on one surface of the piezoelectric layer and arranging a second electrode on the other surface of the piezoelectric layer; and arranging the piezoelectric actuator on the one surface of the channel unit.

According to the second aspect of the present invention, after the low-elasticity material having a smaller modulus of elasticity than the vibration plate is filled in the recess portion of the vibration plate, the piezoelectric layer is formed in the vibration plate by an aerosol deposition method. Here, when the aerosol including the particles of the piezoelectric material and the carrier gas is sprayed on the surface of the vibration plate on which the low-elasticity material is formed, deposition of the piezoelectric material is hindered on the surface of the low-elasticity material. Therefore, formation of the piezoelectric layer on the surface of the recess portion formed in the vibration plate can be prevented just by adding a simple step of filling the low-elasticity material in the recess portion before forming the piezoelectric layer by the AD method. That is, a liquid transporting apparatus which can realize further reduction of the drive voltage and suppression of the crosstalk can be manufactured easily.

In the liquid transporting apparatus according to the present invention, the low-elasticity material may have fluidity.

In this case, since one having fluidity is used as the low-elasticity material, filling of the low-elasticity material in the recess portion can be performed easily. Further, since the recess portion is formed in the vibration plate in advance and then the low-elasticity material is filled therein, the low-elasticity material having fluidity can be settled in a predetermined area where it is desired to prevent formation of the piezoelectric layer.

According to a third aspect of the present invention, there is provided a method of manufacturing a piezoelectric actuator, the method including: providing a base member including a non-interference portion and a vibration plate which is joined on a joining surface thereof to one surface of the base member to cover the non-interference portion, the vibration plate having a stacking surface on which the vibration plate is stacked on the base member and which is located on a side opposite to the joining surface;

forming a recess portion in the stacking surface of the vibration plate at a position corresponding to the non-interference portion;

filling a filler, which thermally decomposes at a first temperature, in the recess of the vibration plate;

forming a stacked body including the vibration plate, the piezoelectric layer, and the filler by forming the piezoelectric layer on the stacking surface of the vibration plate;

heating the stacked body to a temperature equal to or higher than the first temperature to thermally decompose the filler and to remove the filler and a portion of the piezoelectric layer located on a surface of the filler; and forming a first electrode arranged on one surface of the piezoelectric layer and a second electrode arranged on the other surface of the piezoelectric layer.

According to the third aspect of the present invention, after the filler which thermally decomposes at a predetermined temperature (first temperature) is filled in the recess portion of the vibration plate, the piezoelectric layer is formed on the stacking surface of the vibration plate. Then, the stacked body including the vibration plate, the piezoelectric layer and the filler is heated to the predetermined temperature (thermal decomposition temperature of the filler) or higher. Thus, the filler filled in the recess portion is made to thermally decompose and the filler is made to evaporate, and the piezoelectric layer covering the filler on the area facing the recess portion is blown off. Therefore, the piezoelectric layer in the area facing the recess portion can be removed easily.

In the method of manufacturing the piezoelectric actuator according to the present invention, the filler may have fluidity. In this case, since one having fluidity is used as the filler, filling of the filler in the recess portion can be performed easily. Further, since the recess portion is formed in the vibration plate in advance and then the filler is filled therein, the filler having fluidity can be settled in a predetermined area where it is desired to remove the piezoelectric layer.

In the method of manufacturing the piezoelectric actuator according to the present invention, when the filler and the portion of the piezoelectric layer is removed, the stacked body may be heated to a temperature which is not less than a second temperature which is more than the first temperature and at which the piezoelectric layer is annealed.

Depending on the method of forming the piezoelectric layer, there may be a case that a necessary piezoelectric characteristic for deforming the vibration plate cannot be obtained due to a cause such as a small material particle diameter in the formed piezoelectric layer, presence of lattice failure, or the like. In such a case, to improve the piezoelectric characteristic, a heat treatment (annealing) of heating the piezoelectric layer to a predetermined annealing temperature (second temperature) is performed. Here, in the present invention, the stacked body including the piezoelectric layer, the vibration plate, and the filler is heated in the step of removing the filler and the piezoelectric layer to an annealing temperature of the piezoelectric layer or higher, which is higher than the thermal decomposition temperature of the filler. Accordingly, the annealing of the piezoelectric layer and the removal of the filler and the piezoelectric layer on the surface thereof can be performed at the same time, and hence it becomes possible to reduce the manufacturing steps of the piezoelectric actuator.

In the method of manufacturing the piezoelectric actuator according to the present invention, the recess may be formed on the stacking surface of the vibration plate at an area facing the non-interference portion. In this manner, by forming the recess portion in the area of the vibration plate facing the non-interference portion and forming the piezoelectric layer on the vibration plate, and thereafter removing the piezoelectric layer on the surface of the recess portion, the vibration plate becomes easy to deform in the area facing the non-interference portion, and thereby it becomes possible to reduce the drive voltage.

In the method of manufacturing the piezoelectric actuator according to the present invention, the recess may be formed on the stacking surface of the vibration plate at an area facing a peripheral portion of the non-interference portion. In this case, the piezoelectric layer is formed in an area, where the recess portion is not formed, facing a center portion of the non-interference portion. Therefore, by arranging the first electrode and the second electrode so as to sandwich this piezoelectric layer, the center portion area where the piezoelectric layer is formed becomes a driving area where the piezoelectric layer itself contracts to generate a deformation in the vibration plate. On the other hand, the piezoelectric layer is removed in an area, in which the recess portion is formed, facing the peripheral edge portion of the non-interference portion, and hence this area becomes a driven area which deforms in a driven manner according to the deformation of the vibration plate generated by the driving area.

In the method of manufacturing the piezoelectric actuator according to the present invention, the recess may be formed on the stacking surface of the vibration plate at an area facing a center portion of the non-interference portion. In this case, the piezoelectric layer is formed in an area, where the recess portion is not formed, facing a peripheral portion of the non-interference portion. Therefore, by arranging the first electrode and the second electrode so as to sandwich this piezoelectric layer, the peripheral edge portion area where the piezoelectric layer is formed becomes a driving area where the piezoelectric layer itself contracts to generate a deformation in the vibration plate. On the other hand, the piezoelectric layer is removed in an area, in which the recess portion is formed, facing the center portion of the non-interference portion, and hence this area becomes a driven area which deforms in a driven manner according to the deformation of the vibration plate generated by the driving area.

In the method of manufacturing the piezoelectric actuator according to the present invention, the base member may have a plurality of individual non-interference portions as the non-interference portion and a partition wall partitioning the plurality of individual non-interference portions; and the recess may be formed on the stacking surface of the vibration plate at an area facing the partition wall. In this manner, by removing a piezoelectric layer on the surface of the recess portion after forming the recess portion in the area of the vibration plate facing the partition wall portion and forming the piezoelectric layer on the vibration plate, it becomes difficult for a deformation of the vibration plate to propagate between two non-interference portions separated by the partition wall portion, and thus the crosstalk is suppressed.

In the method of manufacturing the piezoelectric actuator according to the present invention, the vibration plate may be composed of a metal material; and a predetermined reference potential may be constantly applied to the first electrode, and one of the reference potential and a predetermined drive potential which is different from the reference potential may be selectively applied to the second electrode, and the method may further include: forming an insulating layer covering the recess on the stacking surface of the vibration plate after the recess is formed in the stacking surface; forming the first electrode on a surface of the insulating layer at an area not facing the recess portion; and forming the second electrode on a surface of the piezoelectric layer on a side opposite to the vibration plate at an area facing the first electrode after forming the piezoelectric layer on a surface of the insulating layer to cover the first electrode.

When the vibration plate is composed of a metal material, the recess portion can be easily formed by etching. However, since the piezoelectric layer on the surface of the recess portion is removed in the removing step, there is a fear that, when the surface of the recess portion remains to be exposed, a short circuit occurs between the recess portion surface of the electrically conductive vibration plate and the second electrode arranged on a side of the piezoelectric layer opposite to the vibration plate. However, in the present invention, since the insulating layer is formed so as to cover the recess portion on a stacking surface of the vibration plate, the short circuit between the vibration plate and the second electrode can be prevented securely. Further, the first electrode arranged on the surface of the piezoelectric layer on the vibration plate side is insulated from the vibration plate having electric conductivity by the insulating layer covering the vibration plate. Further, since this first electrode is covered by the piezoelectric layer, a short circuit between the first electrode and the second electrode is also prevented.

In the method of manufacturing the piezoelectric actuator according to the present invention, may further include heating the stacked body to a temperature lower than a second temperature which is higher than the first temperature and at which the piezoelectric layer is annealed to remove the filler, and then heating the stacked body to third temperature higher than the second temperature to anneal the piezoelectric layer again. In this case, the treatments of removal and annealing can be performed at a temperature suitable for the removal of the filler and a temperature suitable for the annealing respectively, and thus the freedom of adjusting a temperature can be increased.

According to a fourth aspect of the present invention, there is provided a method of manufacturing a liquid transporting apparatus, the method including: providing a channel unit in which a liquid channel including a pressure chamber is formed;

providing a vibration plate which is joined on a joining surface thereof to one surface of the channel unit to cover the pressure chamber, the vibration plate having a stacking surface on a side opposite to the joining surface;

forming a recess in a stacking surface of the vibration plate at a position corresponding to the pressure chamber;

filling a filler which thermally decomposes at a first temperature in the recess of the vibration plate;

forming a stacked body including the vibration plate, the piezoelectric layer, and the filler by forming the piezoelectric layer on the stacking surface of the vibration plate;

heating the stacked body to a temperature not less than the first temperature to thermally decompose the filler and to remove the filler and a portion of the piezoelectric layer located on a surface of the filler;

forming a piezoelectric actuator by arranging a first electrode on one surface of the piezoelectric layer and arranging a second electrode on the other surface of the piezoelectric layer; and arranging the piezoelectric actuator on the one surface of the channel unit.

According to the fourth aspect of the present invention, the filler which thermally decomposes at a predetermined temperature or higher is filled in the recess portion of the vibration plate, and then the piezoelectric layer is formed on the stacking surface of the vibration plate. Then, the stacked body including the vibration plate, the piezoelectric layer, and the filler is heated to the thermal decomposition temperature of the filler or higher. Thus, the filler filled in the recess portion is made to thermally decompose and the piezoelectric layer on the surface thereof is blown off, and thereby the piezoelectric layer on the area facing the recess portion can be removed easily. That is, a piezoelectric actuator capable of realizing further reduction of the drive voltage and suppression of the crosstalk can be manufactured easily.

In the method of manufacturing the liquid transporting apparatus according to the present invention, the filler may have fluidity. In this case, since one having fluidity is used as the filler, filling of the filler in the recess portion can be performed easily. Further, since the recess portion is formed in the vibration plate in advance and then the filler is filled therein, the filler having fluidity can be settled in a predetermined area where it is desired to remove the piezoelectric layer.

According to the present invention, formation of the piezoelectric layer on the surface of the recess portion formed in the vibration plate can be prevented just by adding a simple step of filling the low-elasticity material in the recess portion before forming the piezoelectric layer by the AD method. When one having fluidity is used as the low-elasticity material, filling of the low-elasticity material in the recess portion can be performed easily. Further, since the recess portion is formed in the vibration plate in advance and then the low-elasticity material is filled therein, the low-elasticity material having fluidity can be settled in a predetermined area where it is desired to prevent formation of the piezoelectric layer.

Also, according to the present invention, by filling the filler in the recess portion of the vibration plate, then forming the piezoelectric layer, and thereafter making the filler thermally decompose to thereby blow off the piezoelectric layer covering the filler, the piezoelectric layer in the area facing the recess portion can be removed easily. Further, when one having fluidity is used as the filler, filling of the filler in the recess portion can be performed easily. Moreover, since the recess portion is formed in the vibration plate in advance and then the filler is filled therein, the filler having fluidity can be settled in a predetermined area where it is desired to remove the piezoelectric layer.

BRIEF DESCRIPTION OF THE DRAWINGS

FIG. 6A shows a plate joining step, FIG. 6B shows an insulating layer forming step, and FIG. 6C shows a common electrode forming step;

FIG. 7A shows a low-elasticity material filling step, FIG. 7B shows a piezoelectric layer forming step, FIG. 7C shows a heat treatment step, and FIG. 7D shows an individual electrode forming step and a nozzle plate joining step;

FIG. 11A shows a filling step, FIG. 11B shows a piezoelectric layer forming step, FIG. 11C shows a removing step, and FIG. 11D shows an individual electrode forming step and a nozzle plate joining step;

DETAILED DESCRIPTION OF THE PREFERRED EMBODIMENTS

First Embodiment

Next, a first embodiment of the present invention will be explained. This embodiment is an example of applying the present invention as a liquid transporting apparatus to an ink-jet head which jets ink onto a recording paper for recording.

Figure 1:
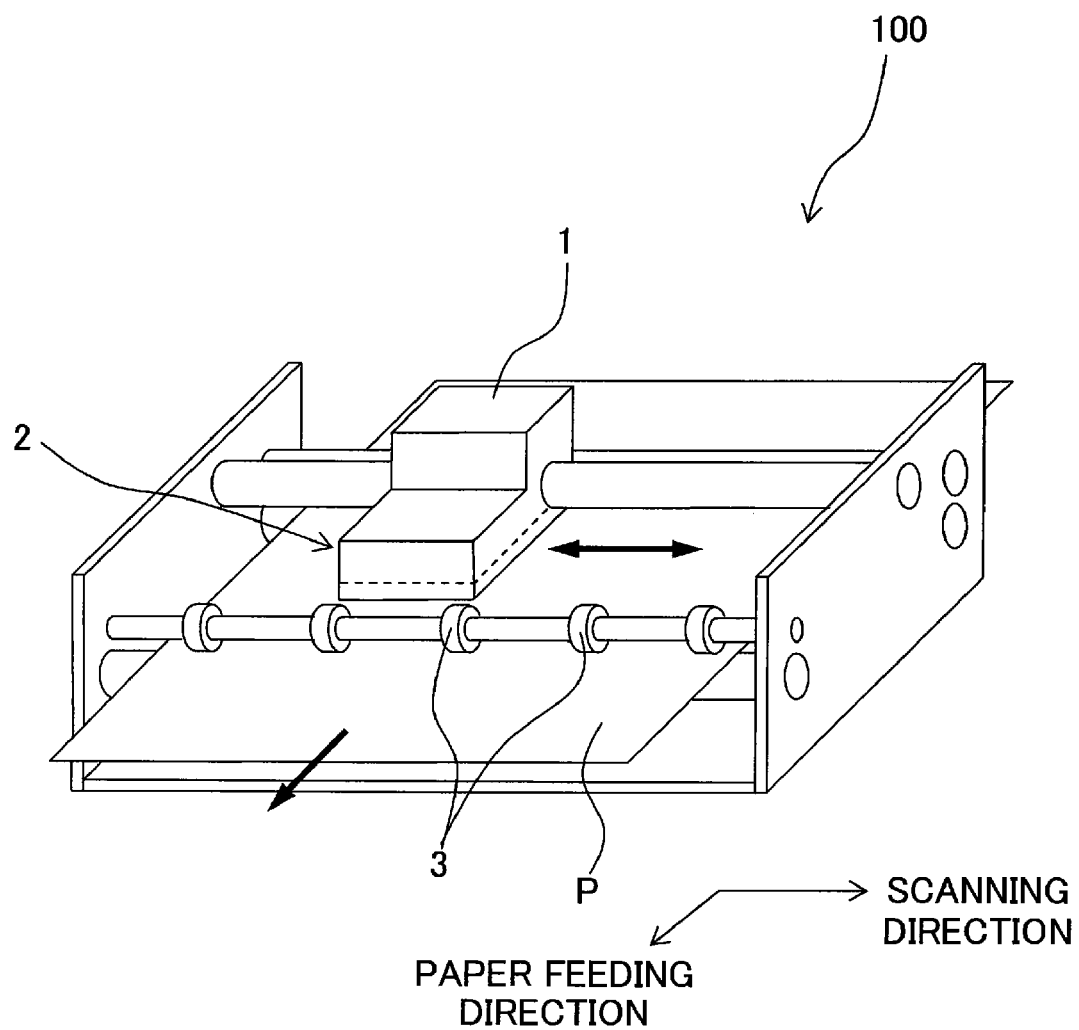
FIG. 1 is a schematic structure view of an ink-jet printer according to an embodiment of the present invention.

First, an ink-jet printer 100 having an ink-jet head 2 of this embodiment will be explained briefly. As shown in FIG. 1, the ink-jet printer 100 has a carriage 1 movable in a left and right direction in FIG. 1, an ink-jet head 2 of serial type which is provided on the carriage 1 and jets ink onto a recording paper P, and feeding rollers 3 which feed the recording paper P in a forward direction in FIG. 1.

While moving in the left and right direction in FIG. 1 integrally with the carriage 1, the ink-jet head 2 jets ink, supplied from an ink cartridge (not shown), through nozzles 20 (see FIGS. 2 to 5) arranged on a lower side thereof onto the recording paper P. Further, the feeding rollers 3 feed the recording paper P in the forward direction in FIG. 1. Then, the ink-jet printer 100 prints a desired image, letter and/or the like on the recording paper P by feeding the recording paper P by the feeding rollers 3 in the forward direction while jetting the ink through the nozzles 20 of the ink-jet head 2 onto the recording paper P to thereby.

Next, the ink-jet head 2 will be explained in detail. As shown in FIGS. 2 to 5, the ink-jet head 2 has a channel unit 4 in which ink channels including nozzles 20 and pressure chambers 14 are formed, and a piezoelectric actuator 5 which applies a pressure to the ink in the pressure chambers 14 so as to jet the ink through the nozzles 20 of the channel unit 4.

Figure 4:
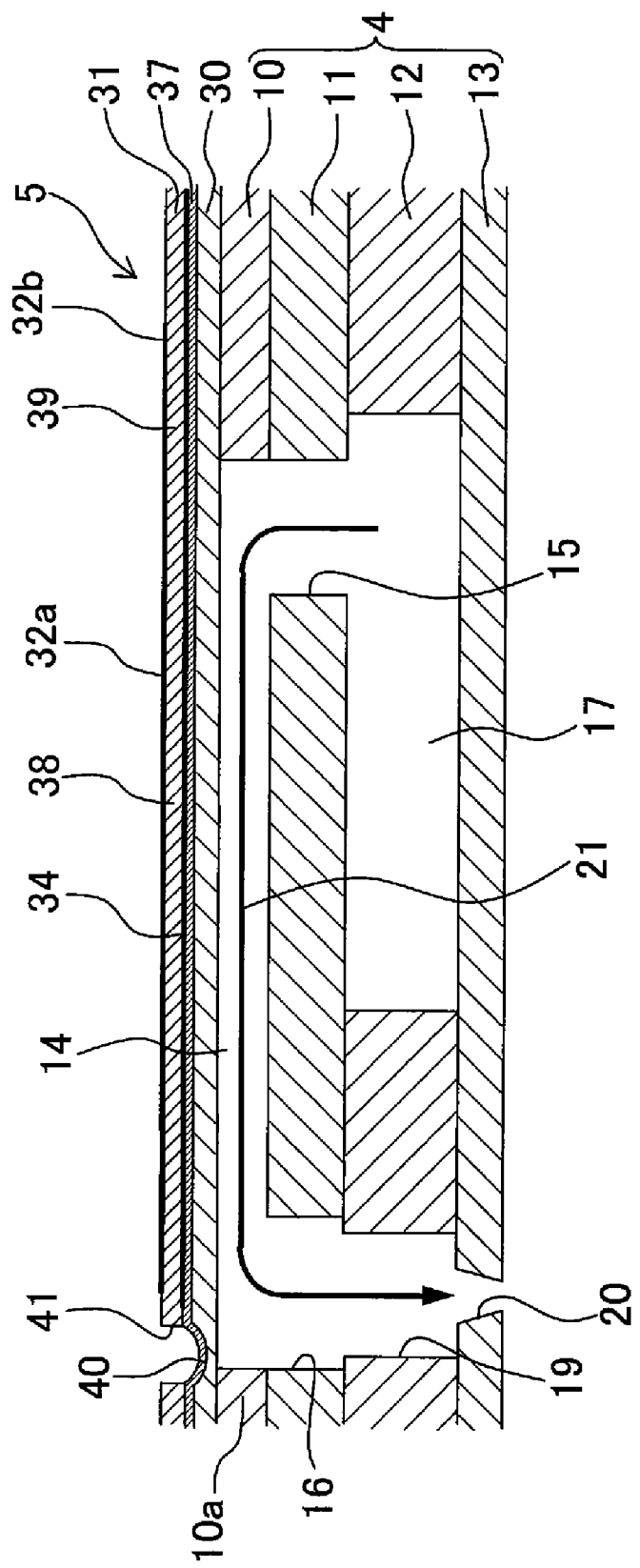
FIG. 4 is a cross-sectional view taken along a line IV-IV in FIG. 3.
Figure 5:
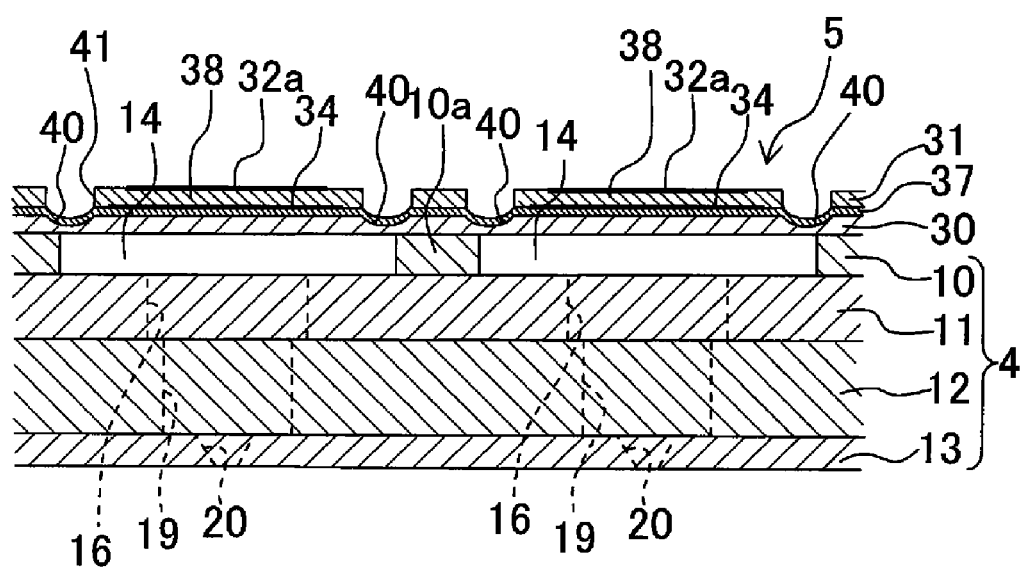
FIG. 5 is a cross-sectional view taken along a line V-V in FIG. 3.

First, the channel unit 4 will be explained. As shown in FIGS. 4 and 5, the channel unit 4 has a cavity plate 10, a base plate 11, a manifold plate 12, and a nozzle plate 13, and these four plates 10 to 13 are joined together in stacked layers. Among these plates, the cavity plate 10, the base plate 11 and the manifold plate 12 are plates made of stainless steel, and in these three plates 10 to 13, the ink channels such as manifolds 17, the pressure chambers 14, which will be explained later, can be formed easily by etching. Further, the nozzle plate 13 is formed of, for example, a high-molecular synthetic resin material such as polyimide, and is adhered on a lower surface of the manifold plate 12.

As shown in FIGS. 2 to 5, among the four plates 10 to 13, the cavity plate 10 located at the uppermost position has the plurality of pressure chambers 14 arranged along the flat surface and formed by holes penetrating the plate 10 vertically. Then, as shown in FIG. 5, each adjacent pair of the pressure chambers 14 is separated by a partition wall portion 10a. Further, the plurality of pressure chambers 14 are arranged in two rows in a zigzag form in a paper feeding direction (up and down direction in FIG. 2). Then, the plurality of pressure chambers 14 are covered by a vibration plate 30 and the base plate 11, which will be explained later, from both upper and lower sides, respectively. Furthermore, each of the pressure chambers 14 is formed in a substantially elliptic shape which is long in a scanning direction (left and right direction in FIG. 2) in a plan view.

Figure 3:
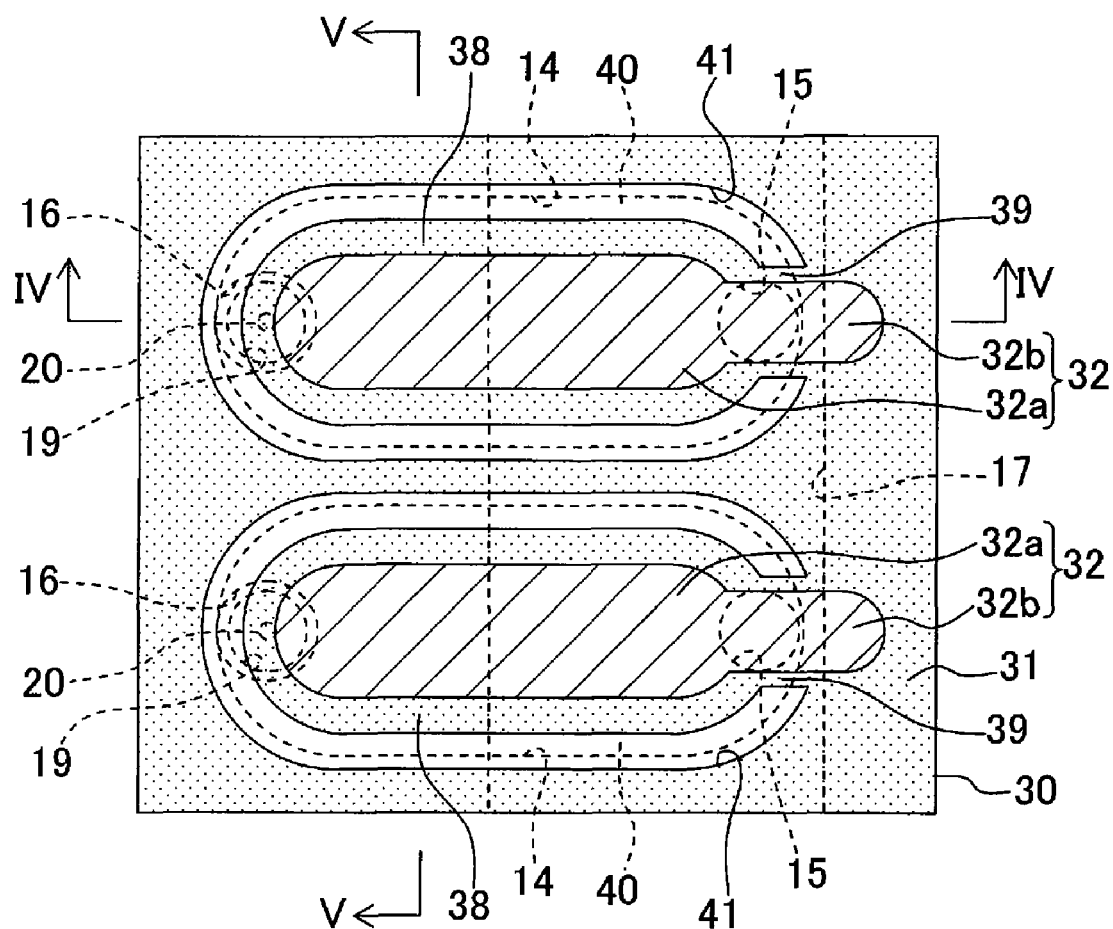
FIG. 3 is a partially enlarged view of FIG. 2.

As shown in FIGS. 3 and 4, communication holes 15, 16 are formed in the base plate 11 at positions overlapping in a plan view, respectively, with both ends of each of the pressure chambers 14. Further, in the manifold plate 12, two manifolds 17 extending in the paper feeding direction are formed so as to overlap with portions on sides of the communication holes 15 of the pressure chambers 14 arranged in two rows in a plan view. These two manifolds 17 communicate with an ink supply hole 18 formed in the vibration plate 30 which will be explained later, and the ink is supplied to the manifolds 17 from an ink tank (not-shown) via the ink supply hole 18. Moreover, a plurality of communication holes 19, communicating to the plurality of communication holes 16 respectively, are formed in the manifold plate 12 at positions overlapping with ends of the plurality of pressure chambers 14 in a plan view on a side opposite to the manifolds 17.

Figure 2:
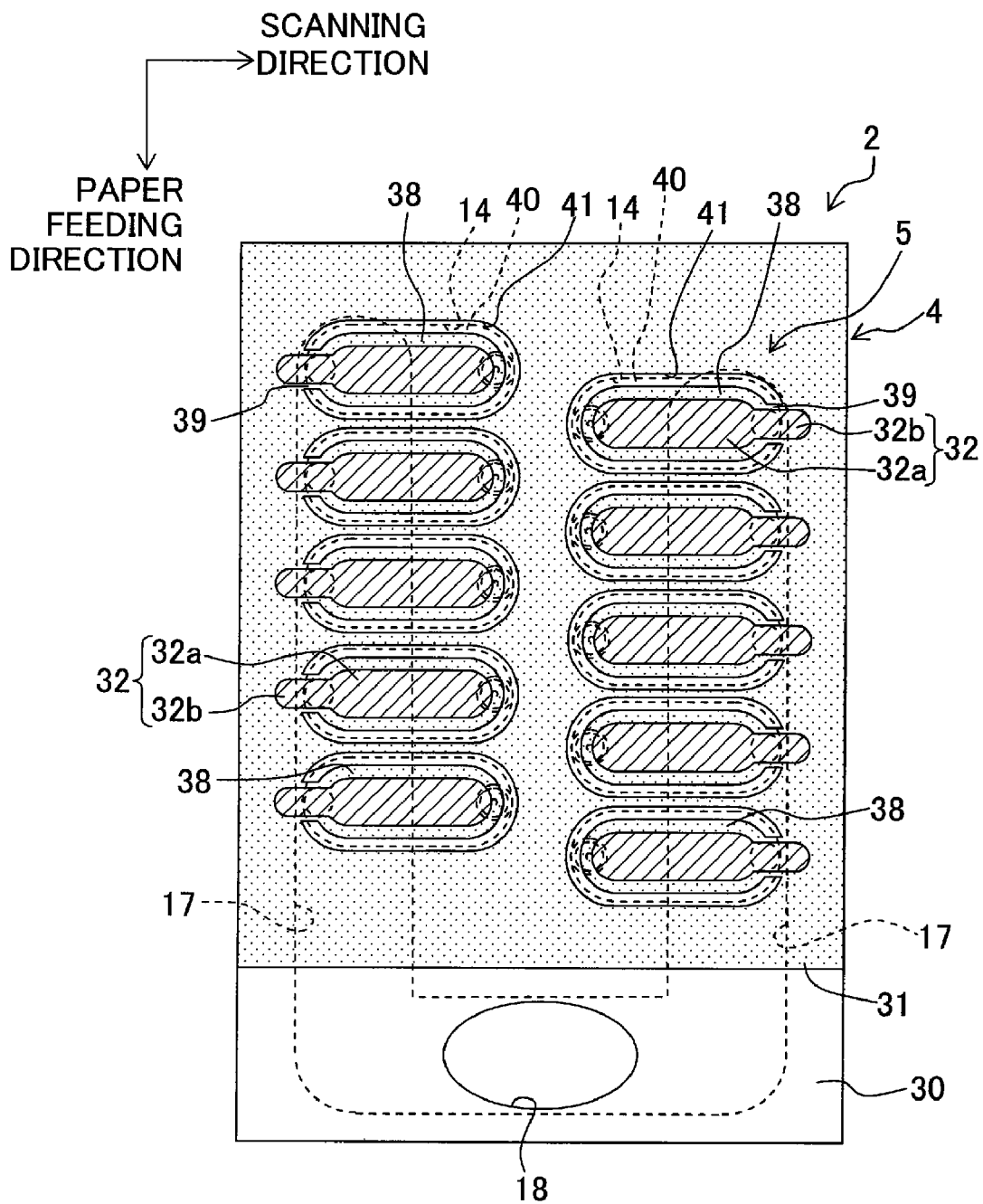
FIG. 2 is a plan view of the ink-jet head.

Further, the plurality of nozzles 20 are formed in the nozzle plate 13 respectively at positions overlapping with the plurality of communication holes 19 in a plan view. As shown in FIG. 2, the plurality of nozzles 20 are arranged so as to overlap respectively with the ends of the plurality of pressure chambers 14, which are arranged in two rows in the paper feeding direction, on a side opposite to the manifolds 17. In other words, the plurality of nozzles 20 are arranged in two rows in a zigzag form corresponding to the plurality of pressure chambers 14 respectively.

Then, as shown in FIG. 4, the manifolds 17 each communicate with one of the pressure chambers 14 via one of the communication holes 15, and further the pressure chambers 14 each communicate with one of the nozzles 20 via the communication holes 16, 19. In this manner, a plurality of individual ink channels 21 are formed in the channel unit 4, each extending from one of the manifolds 17 to one of the nozzles 20 via one of the pressure chambers 14.

Next, the piezoelectric actuator 5 will be explained. As shown in FIGS. 2 to 5, the piezoelectric actuator 5 has a vibration plate 30 arranged on an upper surface of the cavity plate 10 so as to cover the plurality of pressure chambers 14, an insulating layer 37 covering an upper surface (stacking surface) of the vibration plate 30, a piezoelectric layer 31 arranged on the upper surface of the vibration plate 30 covered by the insulating layer 37, a common electrode 34 (first electrode) arranged on a lower surface of the piezoelectric layer 31 (between the insulating layer 37 and the piezoelectric layer 31), and a plurality of individual electrodes 32 (second electrode) arranged on an upper surface of the piezoelectric layer 31.

The vibration plate 30 is a metal plate having a substantially rectangular shape in a plan view, and is composed of, for example, an iron alloy such as stainless steel, a copper alloy, a nickel allow, a titanium alloy, or the like. As shown in FIGS. 4 and 5, in a state that the vibration plate 30 is disposed on the upper surface of the cavity plate 10 so as to cover the plurality of pressure chambers 14, a lower surface (joined surface) of the vibration plate 30 is joined to the partition wall portions 10a of the cavity plate 10. Note that the cavity plate 10 to which the vibration plate 30 is joined corresponds to a base member of the present invention, and the pressure chambers 14 formed in the cavity plate 10 correspond to a deformation acceptable (allowing) portion of the present invention.

In the upper surface of the vibration plate 30, a plurality of recess portions (recess) 40 are formed at positions corresponding to the plurality of pressure chambers 14 respectively. Specifically, each recess portion 40 is a trench (groove) in a substantially ring shape (C shape) that is separated in a part in a circumferential. Then, in an area facing a peripheral portion of one of the pressure chambers 14 on the upper surface of the vibration plate 30, the recess portion 40 extends along substantially the entire circumference of the pressure chamber 14 except an area facing the communication hole 15. Further, as shown in FIG. 3, an outer peripheral shape of the recess portion 40 is slightly larger than an outer peripheral shape of the pressure chamber 14, and the recess portion 40 is formed to cover the edge of the corresponding pressure chamber 14 in a plan view. That is, an inside portion of the recess portion 40 is arranged in an area facing the pressure chamber 14, and an outside portion of the recess portion 40 is arranged in an area not facing the pressure chamber 14.

The insulating layer 37 is formed on the entire upper surface of the vibration plate 30, and surfaces of the plurality of recess portions 40 are covered by the insulating layer 37. As will be explained in detail later, in manufacturing steps of the piezoelectric actuator 5, a heat treatment of the piezoelectric layer 31 is performed after the insulating layer 37 is formed, and hence an insulative material having a high heat resistance temperature is used for the insulating layer 37. As such an insulative material, for example, an insulative ceramic material such as alumina, zirconia, or the like can be used.

The piezoelectric layer 31 is formed of a piezoelectric material mainly composed of a lead zirconate titanate (PZT), which is a ferroelectric solid solution of lead titanate and lead zirconate. The piezoelectric layer 31 is formed so as to cover a plurality of pressure chambers 14 on the upper surface of the vibration plate 30 on which the insulating layer 37 is formed. However, the piezoelectric layer 31 is not formed on the surfaces of the plurality of recess portions 40 of the vibration plate 30. In other words, there is realized a structure in which a plurality of driving portions 38 surrounded by the plurality of through holes 41 respectively are arranged in areas facing center portions of the plurality of pressure chambers 14 by a plurality of through holes 41 being formed in the piezoelectric layer 31 corresponding to the plurality of recess portions 40 respectively. In addition, each of the recess portions 40 is cut in an area facing one end (end on the side of the communication hole 15) of one of the pressure chambers 14, and the piezoelectric layer 31 (coupling portion 39) is formed on the surface of this part cutting the recess portion 40. That is, the piezoelectric layer 31 has a structure in which the plurality of driving portions 38 corresponding to the plurality of pressure chambers 14 respectively are coupled to each other via a plurality of coupling portions 39.

The common electrode 34 is arranged on a surface of the insulating layer 37 (namely, the lower surface of the piezoelectric layer 31), and is insulated from the upper surface of the electrically conductive vibration plate 30 by the insulating layer 37. This common electrode 34 is formed of an electrically conductive material such as gold, copper, silver, palladium, platinum, titanium, or the like. This common electrode 34 is formed so as to face at least all of the plurality of pressure chambers 14. However, the common electrode 34 is not formed in areas facing the recess portions 40 of the vibration plate 30. Also, as described above, by forming the piezoelectric layer 31 in an area other than the areas facing the plurality of recess portions 40, the common electrode 34 is covered completely by the piezoelectric layer 31, and is not exposed. In addition, this common electrode 34 is connected to a not-shown driver IC, and is constantly kept at the ground potential that is the reference potential via this driver IC.

The plurality of individual electrodes 32 are arranged respectively on upper surfaces of the plurality of driving portions 38 of the piezoelectric layer 31. Each of the individual electrodes 32 has a main electrode portion 32a having a substantially elliptic shape in a plan view that is slightly smaller than the pressure chambers 14, and a contact portion 32b extending along the upper surface of the piezoelectric layer 31 from one end of this main electrode portion 32a. The main electrode portion 32a is arranged in an area facing a substantially center portion of one of the pressure chambers 14 (driving portions 38) on the upper surface of the piezoelectric layer 31. On the other hand, the contact portion 32b is drawn out along a longitudinal direction of the main electrode portion 32a from the one end in the longitudinal direction of the main electrode portion 32a on an upper surface of the coupling portion 39 connecting to the driving portion 38, and extends to an area not facing the pressure chamber 14. In addition, the plurality of individual electrodes 32 are also formed of an electrically conductive material such as gold, copper, silver, palladium, platinum, titanium, or the like, similarly to the common electrode 34.

The contact portions 32b of the plurality of individual electrodes 32 are connected to the not-shown driver IC via a flexible printed circuit (FPC). Then, the plurality of individual electrodes 32 are constructed so that one of the ground potential and a predetermined drive potential different from the ground potential is selectively applied thereto from the driver IC.

Next, an operation of the piezoelectric actuator 5 when jetting the ink will be explained. When the drive voltage is applied selectively to the plurality of individual electrodes 32 from the driver IC, potentials of the main electrode portion 32a of the individual electrode 32 to which the drive voltage is applied and the common electrode 34 on the lower side of the piezoelectric layer 31 kept at the ground potential become different from each other, and hence an electric field in a thickness direction is generated in the driving portion 38 of the piezoelectric layer 31 sandwiched between the individual electrode 32 and the common electrode 34. Then, when the polarization direction of the piezoelectric layer 31 and the direction of the electric field are the same, the piezoelectric layer 31 extends in a thickness direction that is the polarization direction and contacts in a horizontal direction, and along with this contraction deformation of the piezoelectric layer 31, a portion of the vibration plate 30 facing one of the pressure chambers 14 deforms so as to project to the pressure chamber 14 side (unimorph deformation). At this time, the volume of the pressure chamber 14 decreases and hence a pressure is applied to the ink therein, and thereby liquid-droplets of the ink are jetted through the nozzle 20 communicating with the pressure chamber 14.

Here, as described above, since one of the driving portions 38, sandwiched between the common electrode 34 and one of the individual electrodes 32, is arranged in the area facing the center portion of one of the pressure chambers 14 on the upper surface of the vibration plate 30, this area becomes a driving area where the driving portion 38 itself contracts and generates a deformation in the vibration plate 30 when the drive potential is applied to the individual electrode 32. On the other hand, an area surrounding the driving area (area facing the peripheral portion of one of the pressure chambers 14) on the upper surface of the vibration plate 30 becomes a driven area where the vibration plate 30 deforms in a driven manner by contraction of the driving portion 38. Then, in this driven area, one of the recess portions 40 is formed in the vibration plate 30, and further, the piezoelectric layer 31 is not arranged on the surface of the recess portion 40. That is, the rigidity of the piezoelectric actuator 5 is locally decreased in the driven area.

In this manner, when the rigidity of the piezoelectric actuator 5 is decreased in the driven area, the vibration plate 30 becomes easy to deform in the area facing one of the pressure chambers 14 when the driving portion 38 contracts in the horizontal direction. In other words, it becomes possible to reduce the drive voltage (voltage between the individual electrode 32 and the common electrode 34) needed for generating a predetermined or larger deformation in the vibration plate 30, and thereby reduce the power consumption of the piezoelectric actuator 5.

Further, when the rigidity of the piezoelectric actuator 5 in the surrounding area of the driving portion 38 is decreased, it becomes difficult, when the driving portion 38 facing one of the pressure chambers 14 contracts, for a deformation generated in the vibration plate 30 according to this contraction to be propagated to an adjacent pressure chamber 14. That is, the crosstalk between adjacent pressure chambers 14 is suppressed.

Figure 8:
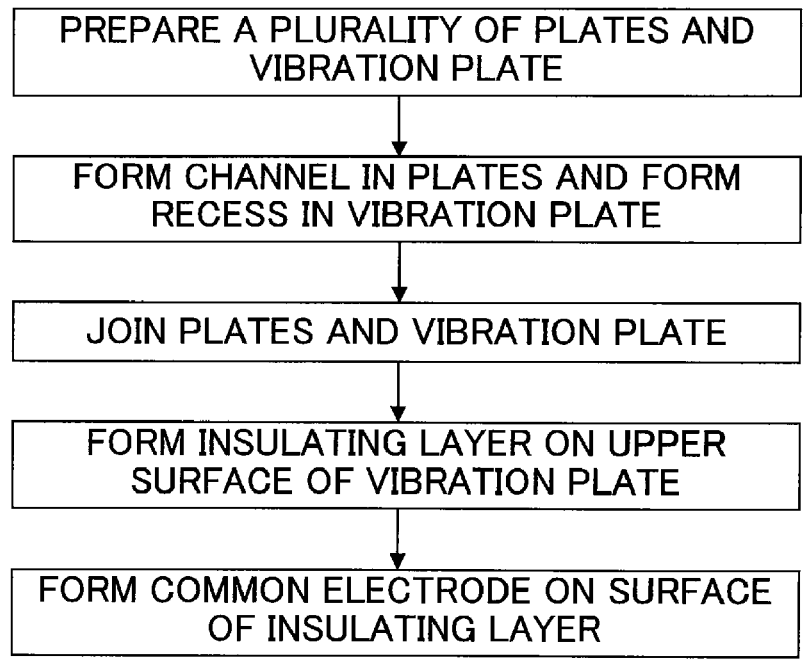
FIG. 8 is a flowchart representing the steps shown in FIGS. 6A to 6D.
Figure 9:
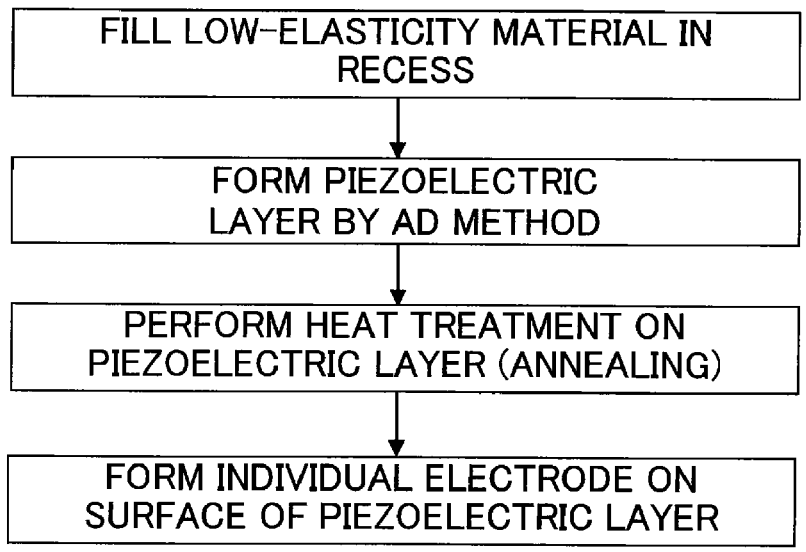
FIG. 9 is a flowchart representing the steps shown in FIGS. 7A to 7D.

Next, a method of manufacturing the ink-jet head 2 of this embodiment will be explained with reference to FIGS. 6A to 6D, FIGS. 7A to 7D, FIG. 8 and FIG. 9. Here, FIGS. 8, 9 are flowcharts representing steps shown in FIGS. 6A to 6D and FIGS. 7A to 7D respectively. First, the plurality of recess portions 40 are formed in areas on the upper surface of the vibration plate 30 which will face the peripheral portions of the plurality of pressure chambers 14 when joined to the cavity plate 10 (recess portion forming step). Here, in this embodiment, since the vibration plate 30 is composed of a metal material, the plurality of recess portions 40 can be formed easily by etching.

On the other hand, holes constituting the ink channels such as the pressure chambers 14 and the manifolds 17 are formed in the cavity plate 10, the base plate 11, and the manifold plate 12 among the plates constituting the channel unit 4. Since these plates 10 to 12 are composed of a metal material similarly to the vibration plate 30, the holes constituting the ink channels can be formed easily by etching.

Figure 6A:
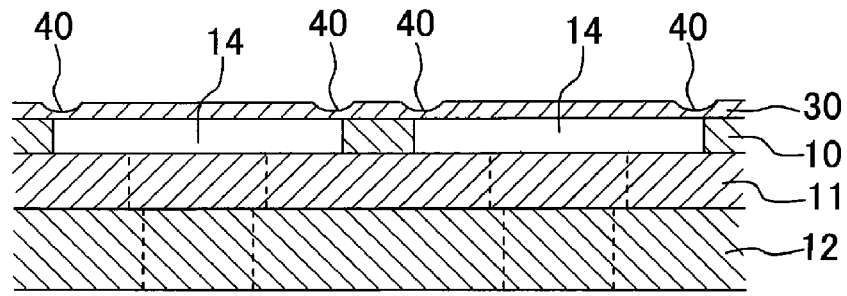
FIGS. 6A to 6C are views showing a method of manufacturing an ink-jet head common to a first and second embodiments, where

Then, as shown in FIG. 6A, the four plates, the vibration plate 30, the cavity plate 10, the base plate 11, and the manifold plate 12 are stacked in layers and joined. In this joining step, for example, the four plates can be joined by metal diffusion bonding by heating the stacked plates to a predetermined temperature (for example, 1000° C.) or higher and pressurizing them at the same time. Alternatively, the four plates can be joined by a ceramic adhesive having high heat resistance.

Figure 6B:
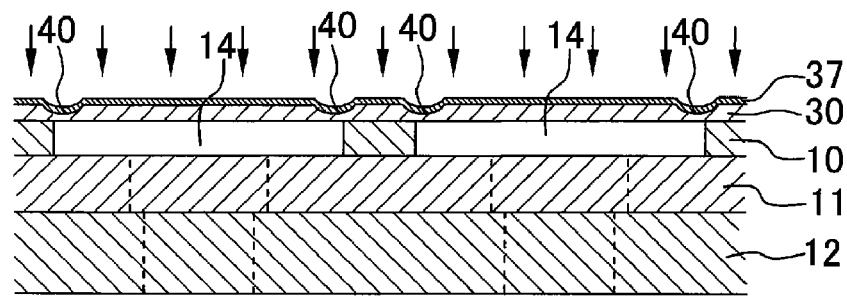

Next, as shown in FIG. 6B, on the upper surface of the vibration plate 30, the insulating layer 37 is formed so as to cover the plurality of recess portions 40 (insulating layer forming step). Here, when using an insulative ceramic material such as alumina or zirconia, the insulating layer 37 can be formed by depositing particles of the ceramic material on the upper surface of the vibration plate 30 by an aerosol deposition method (AD method), a sputtering method, a chemical vapor deposition method (CVD method), or the like.

Figure 6C:
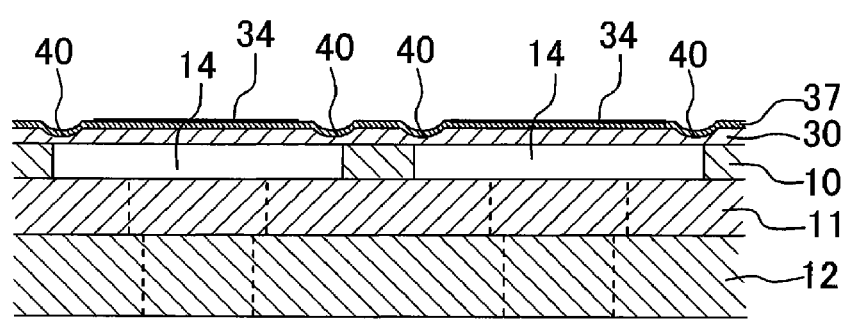

Then, as shown in FIG. 6C, on the surface of the insulative layer 37, the common electrode 34 is formed so as to face all of the plurality of pressure chambers 14 (common electrode (first electrode) forming step). However, this common electrode 34 is not formed in areas facing the plurality of recess portions 40 of the vibration plate 30. This common electrode 34 can be formed by screen printing, a vapor deposition method, a sputtering method, or the like.

Figure 7A:
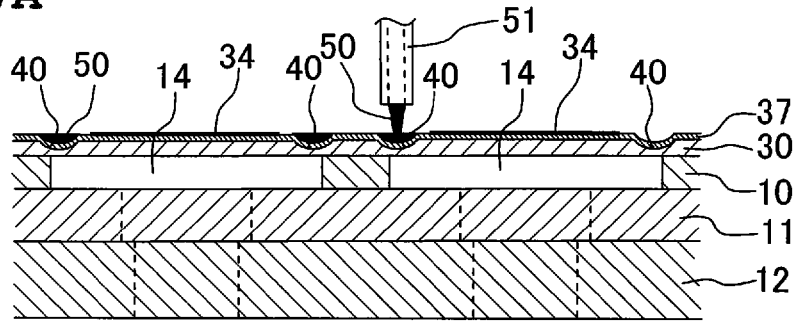
FIGS. 7A to 7D are views showing a method of manufacturing an ink-jet head according to the first embodiment, where

Next, as shown in FIG. 7A, a low-elasticity material 50 having fluidity is filled in the recess portions 40 covered by the insulating layer 37 (low-elasticity material filling step). Here, as the fluidic low-elasticity material 50, there is used one having a modulus of elasticity that is sufficiently lower than the modulus of elasticity of the vibration plate 30 made of metal (approximately 200 GPa) and the modulus of elasticity of the insulating layer 37 such as alumina (approximately 300 GPa) which covers the upper surface of the vibration plate 30, as well as having a thermal decomposition temperature that is sufficiently lower than a heat treatment temperature (annealing temperature: 650° C. to 900° C.) of the piezoelectric layer 31, which will be explained later. For example, epoxy resin (in an uncured state with a thermal decomposition temperature of about 400° C.), fluorine resin (in an uncured state with a thermal decomposition temperature of about 600° C.), or the like can be used.

Figure 10:
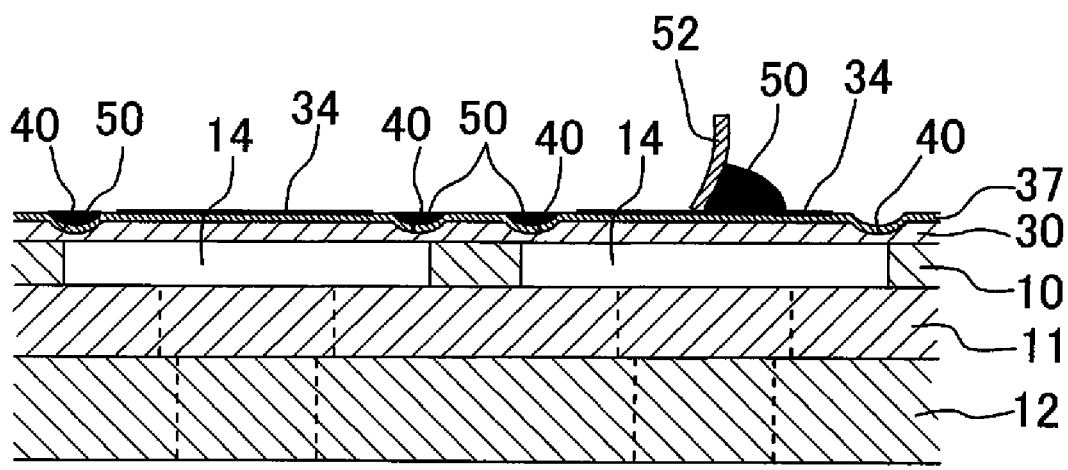
FIG. 10 is a view showing another mode of a step of filling a low-elasticity material or filler.

Here, using a material having fluidity as the low-elasticity material 50, it becomes easy to perform the filling operation in the recess portions 40. For example, as shown in FIG. 7A, a dispenser 51 can be used to inject the low-elasticity material 50 into the recess portions 40. Alternatively, as shown in FIG. 10, it is also possible to use a blade 52 or the like to apply the low-elasticity material 50 on the surface of the insulating layer 37 so as to fill the low-elasticity material 50 in the recess portions 40.

Further, by forming in advance the recess portions 40 in areas corresponding to the pressure chambers 14 on the upper surface of the vibration plate 30, and filling the fluidic low-elasticity material 50 in the recess portions 40, the low-elasticity material 50 having fluidity can be settled in the recess portions 40, and flowing out of the low-elasticity material 50 from a predetermined filling area can be prevented. In addition, the low-elasticity material 50 may be any material as long as it exhibits fluidity at least when being filled, and is not particularly needed to have fluidity after being filled in the recess portions 40.

Figure 7B:
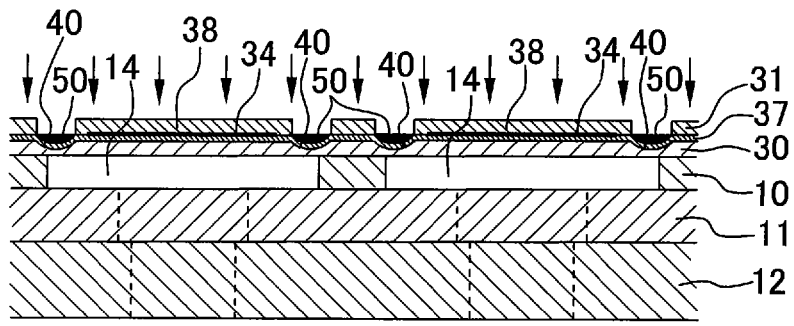

Thereafter, as shown in FIG. 7B, the piezoelectric layer 31 is formed by the AD method on an upper surface of the vibration plate 30 covered by the insulating layer 37 (piezoelectric layer forming step). Specifically, at first, particles of piezoelectric material (PZT) and carrier gas are mixed to generate aerosol by a not-shown aerosol generator. Then, by spraying (blowing) the aerosol including the particles of the piezoelectric material and the carrier gas toward the vibration plate 30 through a film-forming nozzle (not shown), the particles of the piezoelectric material collide with the surface of the insulating layer 37 at high speed and deposit thereon. In addition, as the carrier gas, an inert gas such as helium, argon, or the like, or nitrogen, oxygen, air, or the like can be used.

Incidentally, since the low-elasticity material 50 filled in the recess portions 40 of the vibration plate 30 is a material having a lower modulus of elasticity (rigidity) than the vibration plate 30 and the insulating layer 37, the surface hardness of the recess portion areas in which the low-elasticity material 50 on the upper surface of the vibration plate 30 covered by the insulating layer 37 is filled is lower than that of other areas. Here, it is found by the present inventors that when the aerosol including the particles of the piezoelectric material and the carrier gas is sprayed on the vibration plate 30, deposition of particles is hindered in areas having a lower modulus of elasticity (surface hardness) as compared to areas having a higher modulus of elasticity (surface hardness) (see Japanese Patent Application Laid-open No. 2005-317952).

Therefore, when the aerosol is sprayed on the upper surface of the vibration plate 30 after the low-elasticity material 50 is filled in the recess portions 40 of the vibration plate 30, the particles of the piezoelectric material do not deposit on the surface of the low-elasticity material 50 filled in the recess portions 40 as shown in FIG. 7B, and the piezoelectric layer 31 is formed only on areas excluding the surface of the low-elasticity material 50. That is, the piezoelectric layer 31 (driving portions 38) is formed on the areas surrounded by the recess portions 40 and facing the center portions of the pressure chambers 14 on the upper surface of the vibration plate 30, and meanwhile the piezoelectric layer 31 is not formed on the areas facing the peripheral edge portions of the pressure chambers 14, in which the recess portions 40 are formed. Further, as described above, since the common electrode 34 is not formed on the areas facing the recess portions 40, the piezoelectric layer 31 is formed so as to completely cover the common electrode 34.

Incidentally, when the piezoelectric layer 31 is formed by the AD method, micronization of particles, lattice failure, and/or the like occur while colliding with the vibration plate 30, and hence in this state a necessary piezoelectric characteristic for deforming the vibration plate 30 cannot be obtained. Accordingly, to grow particle crystals of the piezoelectric material and recover lattice failure in the crystals to thereby improve the piezoelectric characteristic, a stacked body including the piezoelectric layer 31, the vibration plate 30, and the plates 10 to 12 is heated to a predetermined annealing temperature to thereby perform a heat treatment (annealing) on the piezoelectric layer 31 (heat treatment step).

The annealing temperature is the higher the better in view of improvement in piezoelectric characteristic of a piezoelectric material, but when the annealing temperature is too high, diffusion of (metal) elements included in the vibration plate 30 made of metal is facilitated, and the elements go over the insulating layer 37 and reach the piezoelectric layer 31. Then, the piezoelectric characteristic of the piezoelectric layer 31 decreases by such diffusion of elements. Accordingly, the annealing temperature is set to a temperature capable of suppressing diffusion of the elements included in the vibration plate 30 to the piezoelectric layer 31. Specifically, the annealing temperature is set between 650° C. and 900° C.

Figure 7C:
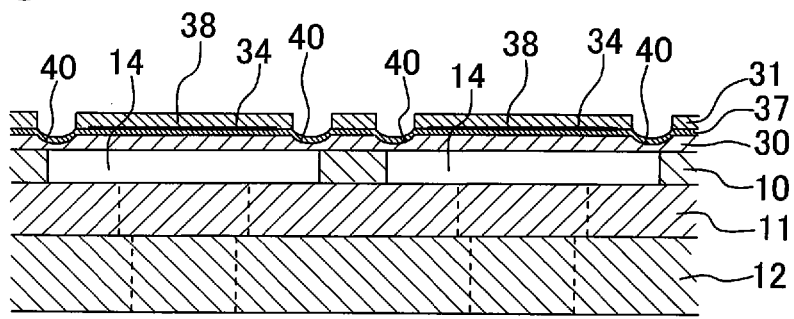

Here, the thermal decomposition temperature of the low-elasticity material 50 filled in the recess portions 40 of the vibration plate 30 is lower than the aforementioned annealing temperature. Accordingly, when the stacked body including the piezoelectric layer 31, the vibration plate 30, and the plates 10 to 12 is heated to 650° C. to 900° C. for performing a heat treatment on the piezoelectric layer 31, the low-elasticity material 50 thermally decomposes and evaporates as shown in FIG. 7C, and consequently the low-elasticity material 50 in the recess portions 40 is removed (removing step).

Figure 7D:
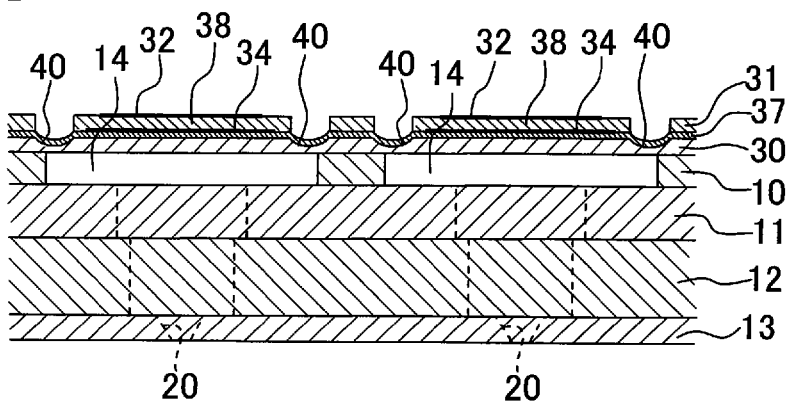

Thereafter, as shown in FIG. 7D, the plurality of individual electrodes 32 are formed on the upper surfaces of the plurality of driving portions 38 of the piezoelectric layer 31, which face the plurality of pressure chambers 14 and the common electrode 34 (individual electrode (second electrode) forming step). The plurality of individual electrodes 32 can be formed by screen printing, a vapor deposition method, a sputtering method, or the like.

Finally, after the plurality of nozzles 20 are formed by laser processing or the like in the nozzle plate 13 made of synthetic resin, the nozzle plate 13 is joined to the lower surface of the manifold plate 12 by an adhesive or the like.

In addition, the nozzle plate 13 may be formed by a metal material such as stainless steel, similarly to the other three plates 10 to 12 constituting the channel unit 4. In this case, the heat resistant temperature of the nozzle plate 13 is higher than the annealing temperature of the piezoelectric layer 31, and hence the nozzle plate 13 may be joined to the manifold plate 12 before the piezoelectric layer forming step. For example, in the plate joining step shown in FIG. 6A, the plates 10 to 12 and the vibration plate 30 and the nozzle plate 13 may be joined at once.

According to the method of manufacturing the ink-jet head 2 as explained above, the following effects are obtained. When the aerosol is sprayed on the upper surface of the vibration plate 30 after the low-elasticity material 50 is filled in the recess portions 40 formed in the vibration plate 30, the piezoelectric material do not deposit on the surface of the low-elasticity material 50 filled in the recess portions 40, and the piezoelectric material 31 is formed only in an area other than the surface of the low-elasticity material 50. That is, just by adding a simple step of filling the low-elasticity material 50 in the recess portions 40 before the piezoelectric layer 31 is formed by the AD method, formation of the piezoelectric layer 31 on the surfaces of the recess portions 40 formed in the vibration plate 30 can be prevented. Also, when a material having fluidity is used as the low-elasticity material 50, filling in the recess portions 40 can be performed easily. Furthermore, since the recess portions 40 are formed in advance in the vibration plate 30, and the low-elasticity material 50 is filled in the recess portions 40, the low-elasticity material 50 can be settled in a predetermined area where it is desired to prevent formation of the piezoelectric layer 31.

Further, since the low-elasticity material 50 in the recess portions 40 is removed after the piezoelectric layer 31 is formed, the rigidity of the entire piezoelectric actuator 5 in the areas where the recess portions 40 are formed can be lowered further. Therefore, the vibration plate 30 becomes further easier to deform in the areas facing the pressure chambers 14, and the drive voltage can be reduced further. Also, the crosstalk between adjacent pressure chambers 14 can be suppressed further. Moreover, by making the low-elasticity material 50 thermally decompose during heat treatment (annealing) of the piezoelectric layer 31, removal of the low-elasticity material 50 can be performed at the same time as annealing of the piezoelectric layer 31, and hence it becomes possible to reduce the manufacturing steps of the piezoelectric actuator 5.

Since the insulating layer 37 is formed so as to cover the plurality of recess portions 40 on the upper surface of the vibration plate 30, the upper surface of the vibration plate 30 is not exposed in the plurality of recess portions 40. Therefore, a short circuit is prevented securely between the electrically conductive vibration plate 30 and the individual electrodes 32 to which the drive voltage is applied. Further, the common electrode 34 on the lower side of the piezoelectric layer 31 is insulated from the vibration plate 30 having electric conductivity by the insulating layer 37. Furthermore, since the common electrode 34 is covered by the piezoelectric layer 31 and is not exposed, a short circuit is prevented also between the common electrode 34 and the individual electrodes 32.

Second Embodiment

Next, a second embodiment of the present invention will be explained. This embodiment is also an example of applying the present invention as a liquid transporting apparatus to an ink-jet head which jets ink onto a recording paper for recording. The same parts as in the method of manufacturing the liquid-transporting apparatus according to the first embodiment will be assigned the same reference numerals, and explanations thereof will be omitted.

Figure 11A:
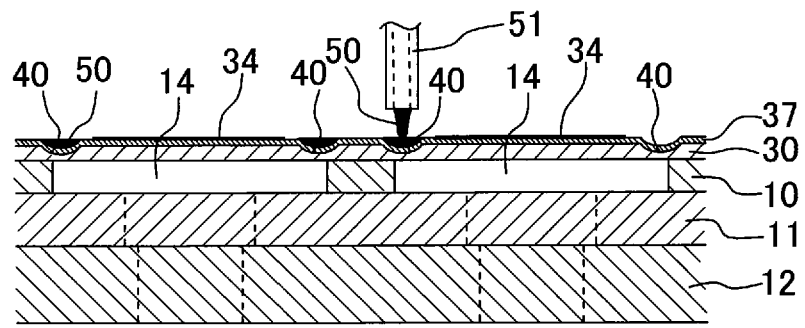
FIGS. 11A to 11D are views showing a method of manufacturing an ink-jet head according to the second embodiment, where

Steps until the step of forming the common electrode 34 so as to face all the pressure chambers 14 on the surface of the insulating layer 37 as shown in FIG. 6C are the same as in the manufacturing steps of the first embodiment. Note that FIG. 12 is a flowchart expressing the steps shown in FIGS. 11A to 11D. After the common electrode 34 is formed, as shown in FIG. 11A, a filler 150 having fluidity is filled in the recess portions 40 covered by the insulating layer 37 (filling step) Here, as the fluidic filler 150, there is used one having a thermal decomposition temperature that is sufficiently lower than a heat treatment temperature (anneal temperature: 650° C. to 900° C.) of the piezoelectric layer 31, which will be explained later. For example, epoxy resin (in an uncured state with a thermal decomposition temperature of 400° C.), fluorine resin (in an uncured state with a thermal decomposition temperature of 600° C.), or the like can be used.

Here, using a material having fluidity as the filler 150, it becomes easy to perform the filling operation in the recess portions 40. For example, as shown in FIG. 11A, a dispenser 51 can be used to inject the filler 150 into the recess portions 40. Alternatively, as shown in FIG. 10, it is also possible to use a blade 52 or the like to apply the filler 150 on the surface of the insulating layer 37 so as to fill the filler 150 in the recess portions 40.

Further, by forming in advance the recess portions 40 in areas corresponding to the pressure chambers 14 of the upper surface of the vibration plate 30, and filling the fluidic filler 150 in the recess portions 40, the filler 150 having fluidity can be settled in the recess portions 40, and flowing out of the filler 150 from a predetermined filling area can be prevented. In addition, the filler 150 may be any material as long as it exhibits fluidity at least when being filled, and is not particularly needed to have fluidity after being filled in the recess portions 40.

Figure 11B:
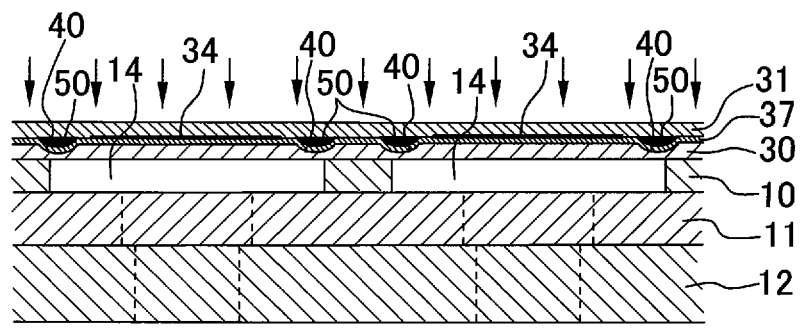
Figure 12:
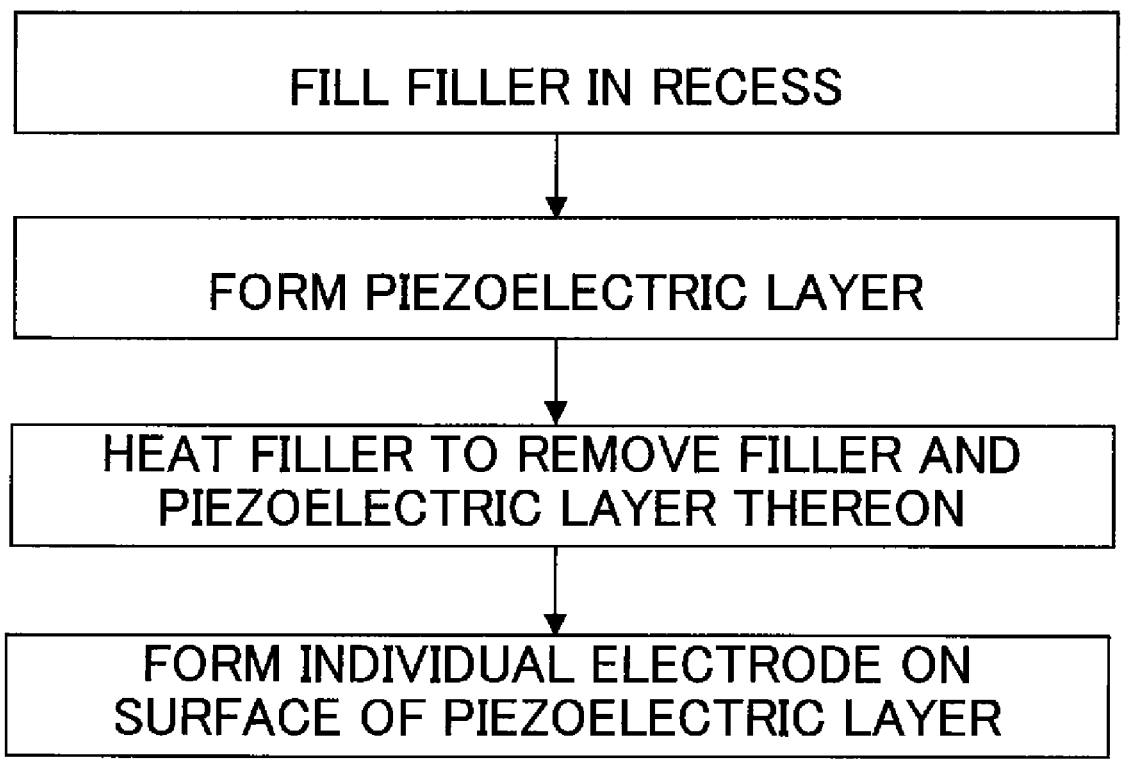
FIG. 12 is a flowchart representing a step shown in FIGS. 11A to 11D.

Thereafter, as shown in FIG. 11B, on the upper surface of the vibration plate 30 covered by the insulating layer 37, the piezoelectric layer 31 is formed so as to cover the plurality of pressure chambers 14 and the surface of the filler 150 in the plurality of recess portions 40 (piezoelectric layer forming step). Here, the piezoelectric layer 31 can be formed by an aerosol deposition (AD) method, a sputtering method, a chemical vapor deposition (CVD) method, a hydrothermal synthesis method, or the like.

Incidentally, in case micronization of particles, lattice failure, and/or the like are generated in the piezoelectric layer 31 when the piezoelectric layer 31 is formed by the AD method or the like, a necessary piezoelectric characteristic for deforming the vibration plate 30 cannot be obtained in this state. Accordingly, in such case, to grow particle crystals of the piezoelectric material and recover lattice failure in the crystals to thereby improve the piezoelectric characteristic, a stacked body including the piezoelectric layer 31, the vibration plate 30, and the plates 10 to 12 is heated to a predetermined annealing temperature or higher to thereby perform a heat treatment (annealing) on the piezoelectric layer 31 (heat treatment step).

Note that the annealing temperature is the higher the better in view of improvement in piezoelectric characteristic of a single piezoelectric material, but when the temperature is too high, diffusion of elements included in the vibration plate 30 made of metal is facilitated, and the elements go over the insulating layer 37 and reach the piezoelectric layer 31. Then, the piezoelectric characteristic of the piezoelectric layer 31 decreases by such diffusion of elements. Accordingly, the annealing temperature is set to a temperature capable of suppressing diffusion of the elements included in the vibration plate 30 to the piezoelectric layer 31. Specifically, the annealing temperature is set between 650° C. and 900° C.

Figure 11C:
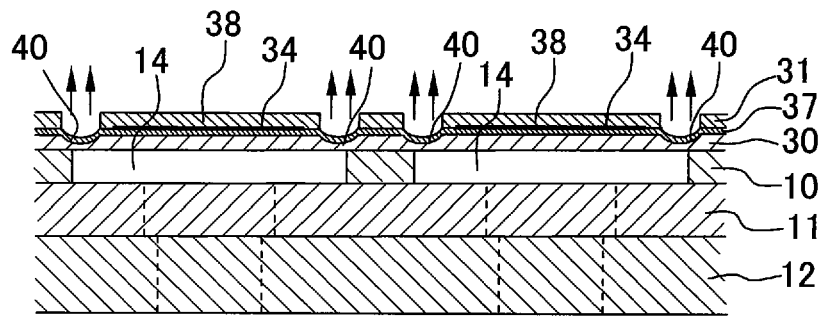
Figure 11D:
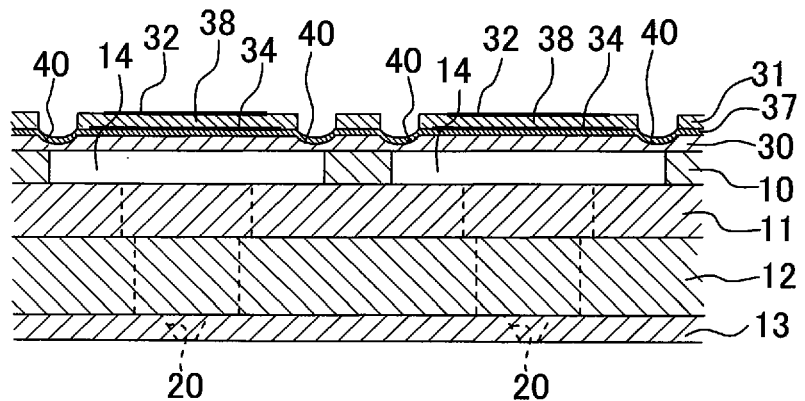

Here, the thermal decomposition temperature of the filler 150 filled in the recess portions 40 of the vibration plate 30 is lower than the aforementioned annealing temperature of the piezoelectric layer 31. Accordingly, when the stacked body 60 including the piezoelectric layer 31, the vibration plate 30, and the plates 10 to 12 is heated to 650° C. to 900° C. for performing annealing on the piezoelectric layer 31, the filler 150 thermally decomposes and consequently the filler 150 evaporates. Then, by making the filler 150 evaporate, the piezoelectric layer 31 in the areas facing the recess portions 40 covering the filler are blown off and removed as shown in FIG. 11C (removing step). Here, since the coefficient of thermal expansion of the filler 150 is larger than that of the piezoelectric layer 31, and the filler 150 expands largely along with heating of the stacked body 60, a part of the piezoelectric layer 31 which covers the filler 150 cracks. When the filler 150 vaporizes by further heating the stacked body 60, pressures in areas of the recess portions 40 which are covered by the piezoelectric layer 31 increase rapidly and portions of the piezoelectric layer 31 which cover the recess portions 40 are blown off. Thus, the piezoelectric layer 31 remained in areas surrounded by the recess portions 40 facing center portions of the pressure chambers 14 become the driving portions 38, respectively. Here, in the removing step, the remained piezoelectric layer 31 which is not blown off may be removed by an adhesive tape or the like.

Thereafter, similarly to the first embodiment, the plurality of individual electrodes 32 are formed on the upper surfaces of the plurality of driving portions 38 of the piezoelectric layer 31, which face the plurality of pressure chambers 14 and the common electrode 34 (individual electrode (second electrode) forming step). The plurality of individual electrodes 32 can be formed by screen printing, a vapor deposition method, a sputtering method, or the like.

Finally, after the plurality of nozzles 20 are formed by laser processing or the like in the nozzle plate 13 made of synthetic resin, the nozzle plate 13 is joined to the lower surface of the manifold plate 12 by an adhesive or the like.

In addition, the nozzle plate 13 may be formed by a metal material such as stainless steel, similarly to the other three plates 10 to 12 constituting the channel unit 4. In this case, the heat resistant temperature of the nozzle plate 13 is higher than the annealing temperature of the piezoelectric layer 31, and hence the nozzle plate 13 may be joined to the manifold plate 12 before the piezoelectric layer forming step. For example, in the plate joining step shown in FIG. 6A, the plates 10 to 12 and the vibration plate 30 and the nozzle plate 13 may be joined at once.

By the method of manufacturing the ink-jet head 2 according to the second embodiment explained above, the following effects are obtained. After the filler 150 is filled in the recess portions 40 of the vibration plate 30 and the piezoelectric layer 31 is formed on the upper surface of the vibration plate 30, the stacked body 60 including the vibration plate 30, the piezoelectric layer 31, and the filler 150 is heated to the thermal decomposition temperature of the filler 150 or higher. Thus, the filler 150 filled in the recess portions 40 is made to thermally decompose and the filler 150 is made to evaporate, and the piezoelectric layer 31 covering the filler 150 is blown off. Thus, the piezoelectric layer 31 in the areas facing the recess portions 40 can be removed easily. Therefore, the piezoelectric actuator 5 which can realize further reduction of the drive voltage and suppression of the crosstalk can be manufactured easily.

Using a filler having a thermal decomposition temperature lower than the annealing temperature of the piezoelectric layer 31 as the filler 150, the filler 150 and the piezoelectric layer 31 on the surface thereof can be removed at the same time as the annealing of the piezoelectric layer 31, and hence the manufacturing steps of the piezoelectric actuator 5 can be reduced. In addition, although the annealing of the piezoelectric layer 31 combines (also serves) the thermal decomposition treatment of the filler 150 in the above embodiment, these heat treatments may be performed independently. For example, when the thermal decomposition temperature of the filler 150 is much lower than the annealing temperature of the piezoelectric layer 31, the thermal decomposition treatment may be performed at a temperature higher than the thermal decomposition temperature of the filler 150 and lower than the annealing temperature of the piezoelectric layer 31, and thereafter the annealing may be performed at a high annealing temperature. That is, heat treatments such as the thermal decomposition treatment, annealing, and the like can be implemented separately in two or more phases.

Also, in accordance with the methods of manufacturing the ink-jet head 2 according to the above-described first and second embodiments, since the insulating layer 37 is formed so as to cover the plurality of recess portions 40 on the upper surface of the vibration plate 30, the upper surface of the vibration plate 30 is not exposed in the plurality of recess portions 40. Therefore, a short circuit is prevented securely between the electrically conductive vibration plate 30 and the individual electrodes 32 to which the drive voltage is applied. Further, the common electrode 34 on the lower side of the piezoelectric layer 31 is insulated from the vibration plate 30 having electric conductivity by the insulating layer 37. Furthermore, since the common electrode 34 is covered by the piezoelectric layer 31 and is not exposed, a short circuit is prevented also between the common electrode 34 and the individual electrodes 32.

Next, modifications in which various changes are made to the first and second embodiments will be explained. However, parts having the same structures as in the above embodiments are assigned the same reference numerals, and explanations thereof will be omitted as appropriate.

First Modification

The areas in which the recess portions are formed on the vibration plate in the first and second embodiments are not limited to the areas facing the peripheral edge portions of the pressure chambers.

Figure 13:
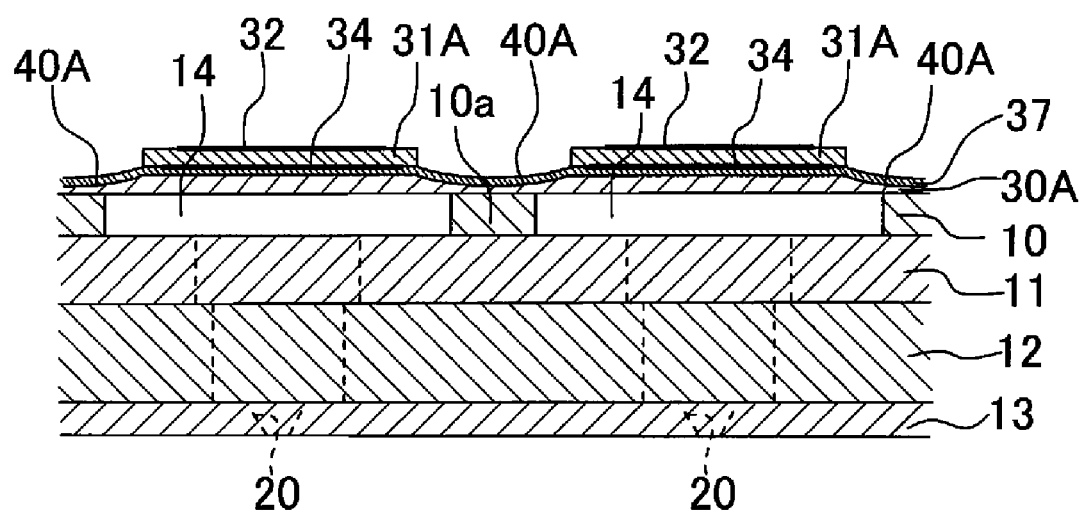
FIG. 13 is a cross-sectional view, corresponding to FIG. 5, of an ink-jet head of a first modification.

For example, as shown in FIG. 13, recess portions 40A may each be formed across a partition wall portion 10a from an area facing the peripheral portion of a pressure chamber 14 to an area facing the peripheral portion of another pressure chamber 14 adjacent thereto on the upper surface of a vibration plate 30A. In this case, when particles of a piezoelectric material are deposited by the AD method after a low-elasticity material is filled in the recess portions 40A, a piezoelectric layer 31A will not be formed on areas facing the peripheral portions of the pressure chambers 14 and the partition wall portions 10a. Alternatively, after the filler 150 is filled in the recess portions 40A to thereby form the piezoelectric layer 31A, the piezoelectric layer 31A on the areas facing the peripheral edge portions of the pressure chambers 14 and the partition wall portions 10a can be removed by heating to the thermal decomposition temperature of the filler or higher. Thus, the rigidity of the piezoelectric actuator in the areas (driven areas) facing the peripheral portions of the pressure chambers 14 is reduced, and thereby the drive voltage can be reduced. In addition thereto, the rigidity of the piezoelectric actuator in the areas facing the partition wall portions 10a is also reduced, and thereby deformation propagation (crosstalk) of the vibration plate 30A between two pressure chambers 14 separated by one of the partition wall portions 10a can be suppressed more effectively.

Second Modification

Figure 14:
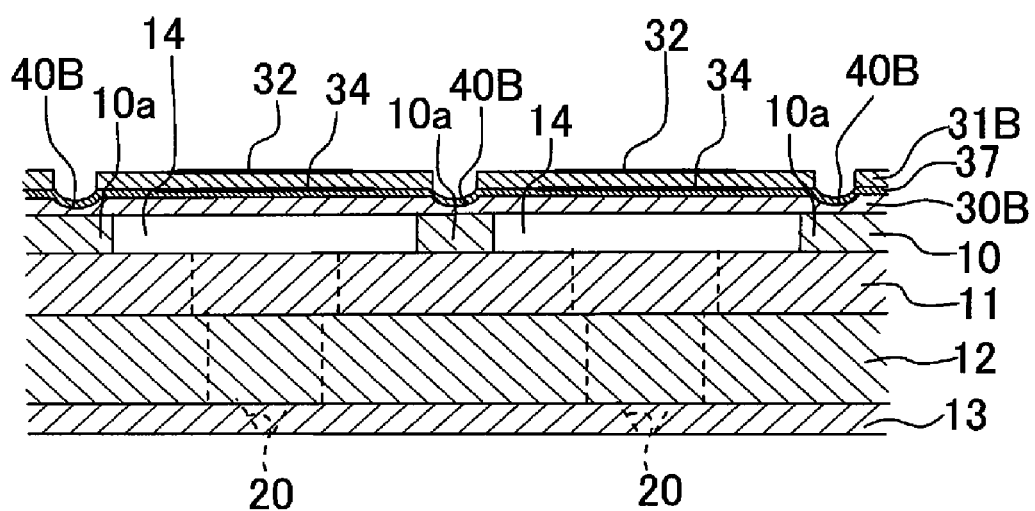
FIG. 14 is a cross-sectional view, corresponding to FIG. 5, of an ink-jet head of a second modification.

The recess portions should not necessarily be formed in the areas facing the pressure chambers on an upper surface of the vibration plate. For example, when it is needed to realize suppression of crosstalk with higher priority than reduction of drive voltage, recess portions 40B may be formed, as shown in FIG. 14, only in areas facing the partition wall portions 10a on an upper surface of a vibration plate 30B that have the largest influence to the crosstalk, with the piezoelectric layer 31 not being formed on surfaces of the recess portions 40B.

Third Modification

In the first and second embodiments, the driving portions of the piezoelectric layer are arranged respectively in the areas facing the center portions of the pressure chambers, and these areas become the driving areas. However, when the positions of the driving portions (driving areas) are different, the positions of the driven areas which deform in a driven manner according to the deformation of the driving portions are also different, and hence the positions where the recess portions should be formed change inevitably.

Figure 15:
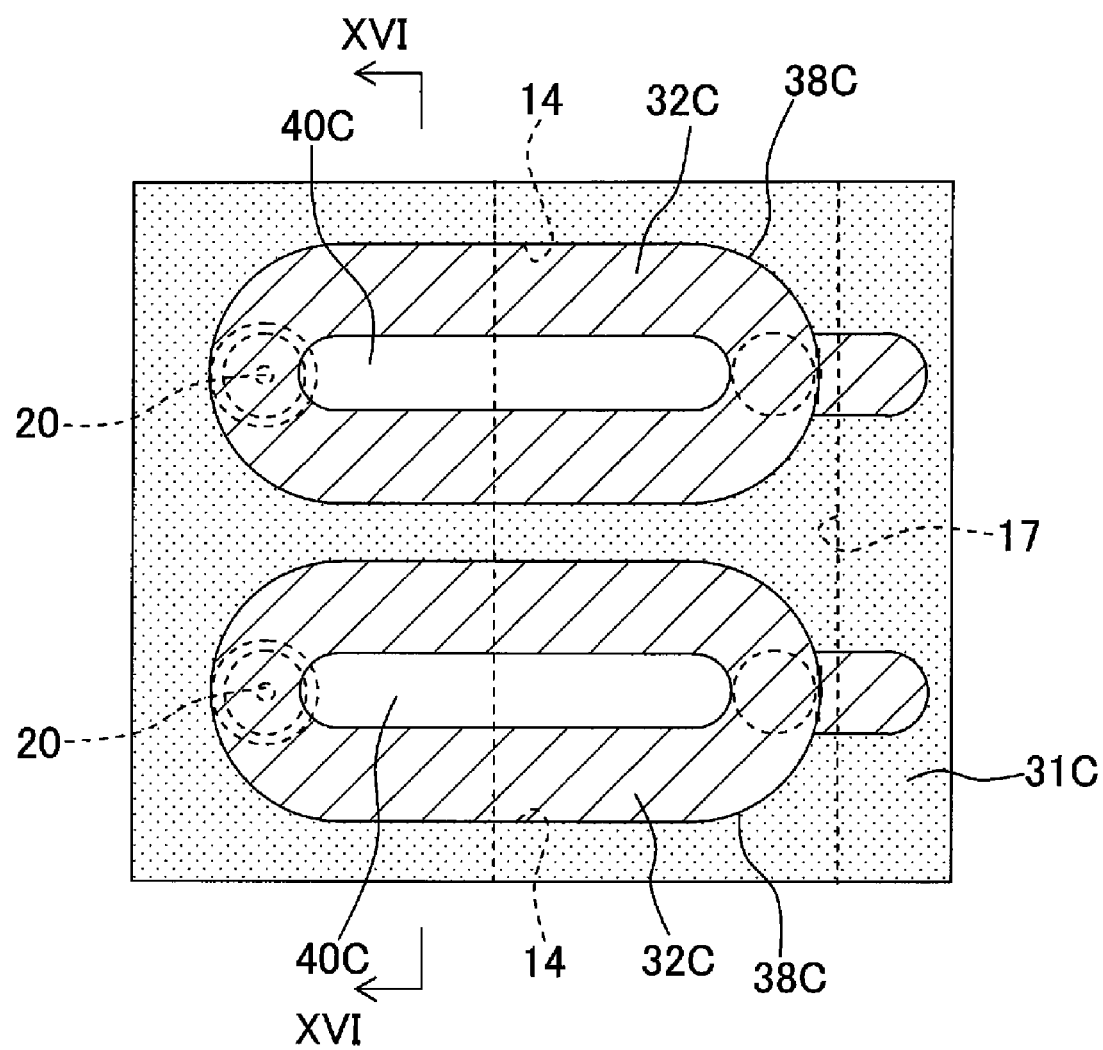
FIG. 15 is a partially enlarged plan view of an ink-jet head of a third modification.
Figure 16:
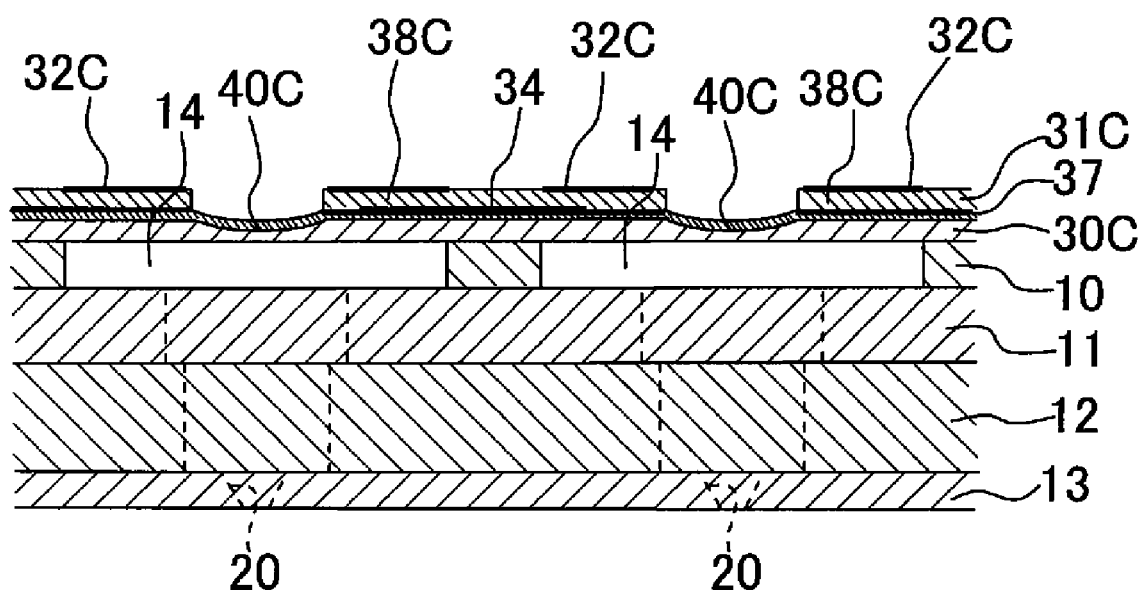
FIG. 16 is a cross-sectional view taken along a line XV-XV in FIG. 15.

For example, as shown in FIGS. 15 and 16, when annular driving portions 38C as portions of a piezoelectric layer 31C are formed in areas facing peripheral portions of the pressure chambers 14 on an upper surface of a vibration plate 30C, and annular individual electrodes 32C are arranged on upper surfaces of the driving portions 38C, the areas facing the peripheral portions of the pressure chambers 14 become driving areas, and areas facing center portions of the pressure chambers 14 become driven areas. When manufacturing such a piezoelectric actuator, first the recess portions 40C are formed in the driven areas facing the center portions of the pressure chambers 14 on the upper surface of the vibration plate 30C. Then, the piezoelectric layer 31C (driving portions 38C) may be formed only in the driving areas facing the peripheral portions of the pressure chambers 14 by filling a low-elasticity material in the recess portions 40C and depositing particles of a piezoelectric material on the upper surface of the vibration plate 30C by the AD method. Alternatively, the piezoelectric layer 31C (driving portions 38C) on the driving areas facing the peripheral portions of the pressure chambers 14 may be formed by filling a filler in the recess portions 40C, then forming the piezoelectric layer 31C, and thereafter making the filler 150 evaporate by thermal decomposition to thereby remove the piezoelectric layer 31C on the areas facing the center portions of the pressure chambers 14.

Fourth Modification

Figure 17:
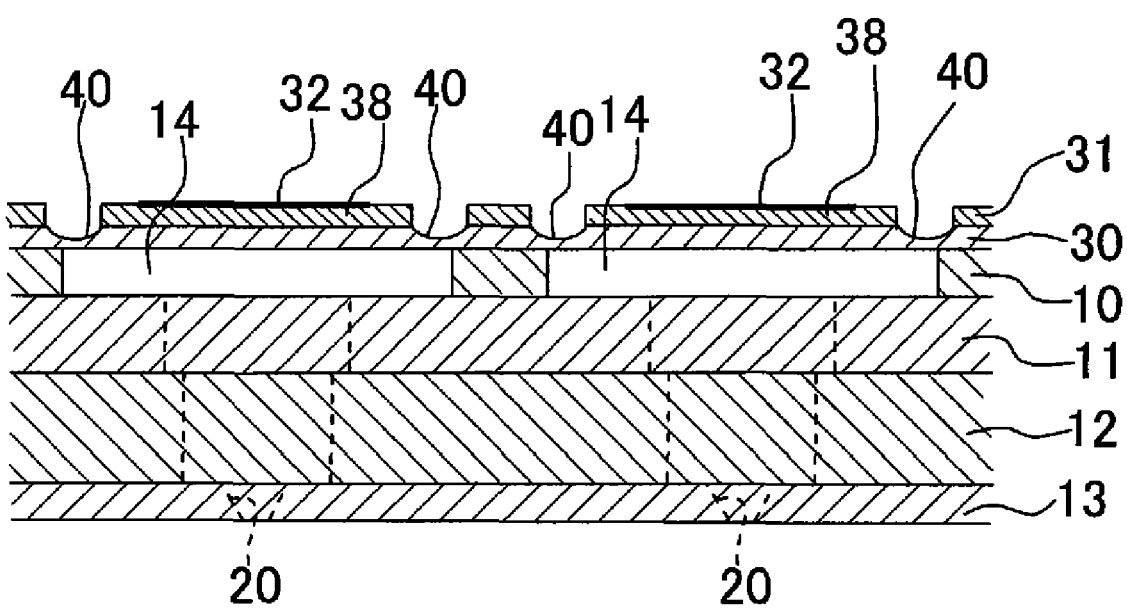
FIG. 17 is a cross-sectional view, corresponding to FIG. 5, of an ink-jet head of a fourth modification.

As shown in FIG. 17, by keeping the vibration plate 30 made of metal at the ground potential constantly, the upper surface of the vibration plate 30 can be used as the common electrode (first electrode) facing the plurality of individual electrodes 32. In this case, the step of forming the common electrode separately is no longer necessary, and also the structure of the piezoelectric actuator becomes simple. Note that in the fourth modification, differently from the first and second embodiments, as a matter of course it is not necessary to cover the upper surface of the vibration plate 30 as the common electrode with the insulating layer 37. However, since the particles of the piezoelectric material do not deposit on the surfaces of the recess portions 40, electrically conductive surfaces of the recess portions 40 are exposed, and there is a fear that a short circuit occurs between the surfaces of the recess portions 40 and the individual electrodes 32. Accordingly, to prevent this short circuit, only the surfaces of the recess portions 40 within the upper surface of the vibration plate 30 may be covered by an insulating layer.

Fifth Modification

Figure 18:
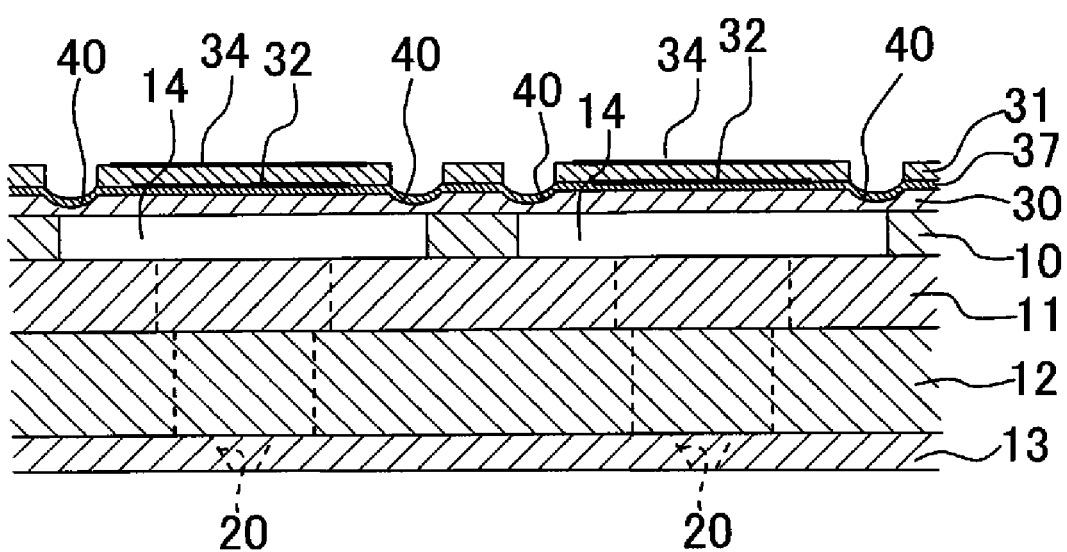
FIG. 18 is a cross-sectional view, corresponding to FIG. 5, of an ink-jet head of a fifth modification.

As shown in FIG. 18, the common electrode 34, which is kept at the ground potential (reference potential) constantly, may be arranged on the upper surface of the piezoelectric layer 31, and the individual electrodes 32 to which one of the ground potential and the driving potential is selectively applied may be formed on the surface of the insulating layer 37 and arranged on the lower surface of the piezoelectric layer 31 (between the piezoelectric layer 31 and the insulating layer 37).

Sixth Modification

Figure 19:
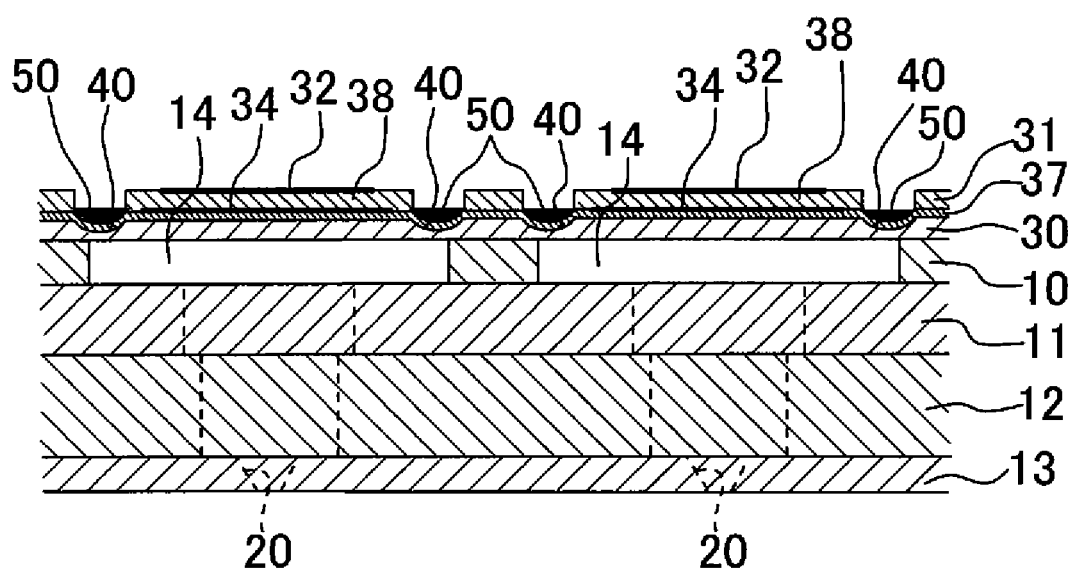
FIG. 19 is a cross-sectional view, corresponding to FIG. 5, of an ink-jet head of a sixth modification.

In the first embodiment, as the low-elasticity material to be filled in the recess portions of the vibration plate, it is also possible to use a material having a thermal decomposition temperature that is higher than the heat treatment temperature of the piezoelectric layer. In this case, as shown in FIG. 19, the low-elasticity material 50 remains in the recess portions 40 even after the heat treatment of the piezoelectric layer 31. Accordingly, as compared to the case where the low-elasticity material 50 is removed from the recess portions 40 as in the aforementioned embodiment, the rigidity of the piezoelectric actuator in the areas where the recess portions 40 are formed becomes higher to some extent. However, as compared to a mode in which the piezoelectric layer 31 is not formed locally on the upper surface of a flat vibration plate having no recess portions, the rigidity of the piezoelectric actuator decreases by the amount that the thickness of the vibration plate 30 having high rigidity is smaller.

Seventh Modification

In the second modification, the annealing of the piezoelectric layer is not always necessary. Depending on the method of forming the piezoelectric layer, a desired piezoelectric characteristic can be assured and hence annealing becomes no longer necessary. In addition, it is also possible to form the piezoelectric layer by joining to the vibration plate a piezoelectric sheet obtained by burning a green sheet composed of a piezoelectric material, and in this case a heat treatment after joining to the vibration plate is not necessary. Furthermore, in relation with the other manufacturing steps, in some cases it is better to perform a step of removing the filler separately from the annealing.

Therefore, regardless of whether the annealing of the piezoelectric layer is performed or not, it may also be performed separately a step of heating the stacked body including the piezoelectric layer, the vibration plate, and the filler to the thermal decomposition temperature of the filler or higher so as to remove the filler and the piezoelectric layer on the surface thereof.

Note that the vibration plate should not necessarily be a metal plate in the above-described first and second embodiments, and a vibration plate formed of a material other than metal (for example, a ceramic material such as alumina and zirconia, a silicon, and the like) can also be used as long as it has rigidity to a degree capable of performing unimorph deformation according to contraction of the driving portions. In this case, the most preferable method of forming the recess portions 40 in the vibration plate is supersonic machining. Further, the low-elasticity material or the filler have fluidity in the above-described first and second embodiments, but it is not always necessary that the low-elasticity material and the filler have fluidity. For example, a solid low-elasticity material or filler in a pellet or bar form may be filled in the recess portions of the vibration plate, subsequently the low-elasticity material or filler may be cured in the recess portions by, for example, heating or the like, and thereafter the piezoelectric layer may be formed by the AD method on the surface of the vibration plate in which the recess portions are formed. Here, the reason for curing the low-elasticity material or filler is to prevent bouncing off of the low-elasticity material or the filler due to impact when making material particles of the piezoelectric layer collide with the low-elasticity material or filler at high speed in the AD method. Accordingly, the curing of the filler may be omitted in the case where the piezoelectric layer is formed by a method other than the AD method, where there is no fear that excessive shock is applied to the filler.

In the foregoing, as the embodiments of the present invention, explanations are given with an example of applying the present invention to a piezoelectric actuator of an ink-jet head which applies a jetting pressure to ink in pressure chambers, but the subject to which the present invention is applied is not limited thereto. For example, the present invention can be applied to a piezoelectric actuator as a liquid transfer actuator of a liquid transporting apparatus which transfers liquid such as chemical solution or biochemical solution in the micro total analysis system (μTAS), a liquid transporting apparatus which transfers liquid such as solvent or chemical solution in a micro chemical system, or the like.

Furthermore, the subject to which the present invention is applied is not limited to the actuator for applying a pressure to liquid such as ink. Specifically, the present invention may also be applied to a piezoelectric actuator used for application other than transfer of liquid, such as an actuator which allows deformation of a vibration plate in a deformation allowing portion of a base member, and presses and drives various types of objects by a deforming portion of the vibration plate.

What is claimed is:

1. A method of manufacturing a piezoelectric actuator, the method comprising:
   providing a base member including a non-interference portion and a vibration plate including a joining surface which is joined to the base member to cover the non-interference portion, the vibration plate having a stacking surface which is located on a side opposite to the joining surface;
   forming a recess in the stacking surface of the vibration plate at a position corresponding to the non-interference portion;
   filling, in the recess of the vibration plate, a low-elasticity material having a modulus of elasticity lower than that of the stacking surface of the vibration plate;
   forming a piezoelectric layer by blowing aerosol including particles of a piezoelectric material and a carrier gas onto the stacking surface of the vibration plate to deposit the particles of the piezoelectric material on an area, of the stacking surface, different from a surface of the low-elasticity material filled in the recess, such that the piezoelectric layer is not formed in an area facing the recess of the vibration plate; and
   forming a first electrode arranged on one surface of the piezoelectric layer and a second electrode arranged on the other surface of the piezoelectric layer.

2. The method of manufacturing the piezoelectric actuator according to claim 1, wherein the low-elasticity material is shaped to have a pellet or bar form.

3. The method of manufacturing the piezoelectric actuator according to claim 1, wherein the low-elasticity material has fluidity.

4. The method of manufacturing the piezoelectric actuator according to claim 3, further comprising removing the low-elasticity material after the piezoelectric layer is formed.

5. The method of manufacturing the piezoelectric actuator according to claim 4, further comprising performing a heat treatment on the piezoelectric layer after the piezoelectric layer is formed, wherein a thermal decomposition temperature of the low-elasticity material is lower than a heat treatment temperature for the piezoelectric layer in the heat treatment.

6. The method of manufacturing the piezoelectric actuator according to claim 3, wherein the recess is formed on the stacking surface of the vibration plate at an area facing the non-interference portion.

7. The method of manufacturing the piezoelectric actuator according to claim 6, wherein the recess is formed on the stacking surface of the vibration plate at an area facing a peripheral portion of the non-interference portion.

8. The method of manufacturing the piezoelectric actuator according to claim 6, wherein the recess is formed on the stacking surface of the vibration plate at an area facing a center portion of the non-interference portion.

9. The method of manufacturing the piezoelectric actuator according to claim 3, wherein the base member has a plurality of individual non-interference portions as the non-interference portion and a partition wall partitioning the plurality of individual non-interference portions; and
   the recess is formed on the stacking surface of the vibration plate at an area facing the partition wall.

10. The method of manufacturing the piezoelectric actuator according to claim 3, wherein the vibration plate is composed of a metal material, a predetermined reference potential is constantly applied to the first electrode, and one of the reference potential and a predetermined drive potential that is different from the reference potential, is selectively applied to the second electrode, and the method further comprising:

forming an insulating layer covering the recess on the stacking surface of the vibration plate after the recess is formed in the stacking surface;

forming the first electrode on a surface of the insulating layer at an area not facing the recess; and forming the second electrode, on the other surface of the piezoelectric layer on a side opposite to the vibration plate, at an area facing the first electrode after forming the piezoelectric layer on a surface of the insulating layer to cover the first electrode.

11. A method of manufacturing a liquid transporting apparatus, comprising:

providing a channel unit in which a liquid channel including a pressure chamber is formed;

providing a vibration plate including a joining surface which is joined to one surface of the channel unit to cover the pressure chamber, the vibration plate having a stacking surface which is located on a side opposite to the joining surface;

forming a recess in the stacking surface of the vibration plate at a position corresponding to the pressure chamber;

filling, in the recess of the vibration plate, a low-elasticity material having a modulus of elasticity lower than the stacking surface of the vibration plate;

forming the piezoelectric layer by blowing aerosol including particles of a piezoelectric material and a carrier gas onto the stacking surface of the vibration plate to deposit the particles of the piezoelectric material on an area different from a surface of the low-elasticity material filled in the recess, such that the piezoelectric layer is not formed in an area facing the recess of the vibration plate; and forming a piezoelectric actuator by arranging a first electrode on one surface of the piezoelectric layer and arranging a second electrode on the other surface of the piezoelectric layer.

12. The method of manufacturing the liquid transporting apparatus according to claim 11, wherein the low-elasticity material has fluidity.

* * * * *